(12) United States Patent
Ueno et al.

(10) Patent No.: US 10,170,564 B2
(45) Date of Patent: Jan. 1, 2019

(54) MANUFACTURING METHOD OF SEMICONDUCTOR DEVICE AND SEMICONDUCTOR DEVICE

(71) Applicant: FUJI ELECTRIC CO., LTD., Kanagawa (JP)

(72) Inventors: Katsunori Ueno, Matsumoto (JP); Shinya Takashima, Hachioji (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/607,692

(22) Filed: May 30, 2017

(65) Prior Publication Data

US 2018/0012964 A1   Jan. 11, 2018

(30) Foreign Application Priority Data

Jul. 11, 2016 (JP) .................................. 2016-136796

(51) Int. Cl.
| | |
|---|---|
| H01L 31/0336 | (2006.01) |
| H01L 29/207 | (2006.01) |
| H01L 29/20 | (2006.01) |
| H01L 29/423 | (2006.01) |
| H01L 29/66 | (2006.01) |
| H01L 29/78 | (2006.01) |

(52) U.S. Cl.
CPC ........ *H01L 29/207* (2013.01); *H01L 29/2003* (2013.01); *H01L 29/42356* (2013.01); *H01L 29/66522* (2013.01); *H01L 29/66666* (2013.01); *H01L 29/7827* (2013.01)

(58) Field of Classification Search
CPC ...................... H01L 29/66666; H01L 29/7827
See application file for complete search history.

(56) References Cited

U.S. PATENT DOCUMENTS

| | | | | |
|---|---|---|---|---|
| 7,038,253 B2* | 5/2006 | Yoshida | ............ | H01L 29/66462 257/188 |
| 7,339,206 B2* | 3/2008 | Akamatsu | ........... | H01L 29/0657 257/189 |

(Continued)

FOREIGN PATENT DOCUMENTS

JP    2007-258578 A    10/2007

OTHER PUBLICATIONS

Tohru Oka et al. "Vertical GaN-based trench metal oxide semiconductor field-effect transistors on a free-standing GaN substrate with blocking voltage of 1.6 kV," Applied Physics Express, published Jan. 28, 2014, vol. 7, No. 2,021002.

*Primary Examiner* — Thao P Le

(57) ABSTRACT

Provided is a manufacturing method of a semiconductor device including a vertical MOSFET having a planar gate. The manufacturing method of a semiconductor device includes forming a n-type gallium nitride layer on a gallium nitride monocrystalline substrate, and forming an impurity-implanted region that contains impurities at a uniform concentration in a direction parallel to a main surface of the gallium nitride monocrystalline substrate, by ion-implanting the impurities into the n-type gallium nitride layer, where the impurities include at least one type selected from among magnesium, beryllium, calcium and zinc. Here, at least part of the impurity-implanted region serves as a channel forming region of the vertical MOSFET.

10 Claims, 31 Drawing Sheets

(56) References Cited

U.S. PATENT DOCUMENTS 7,855,155 B2 * 12/2010 Niiyama ................ B82Y 20/00
                                                          438/795
8,586,433 B2 * 11/2013 Minoura ............. H01L 29/0653
                                                          257/615

* cited by examiner

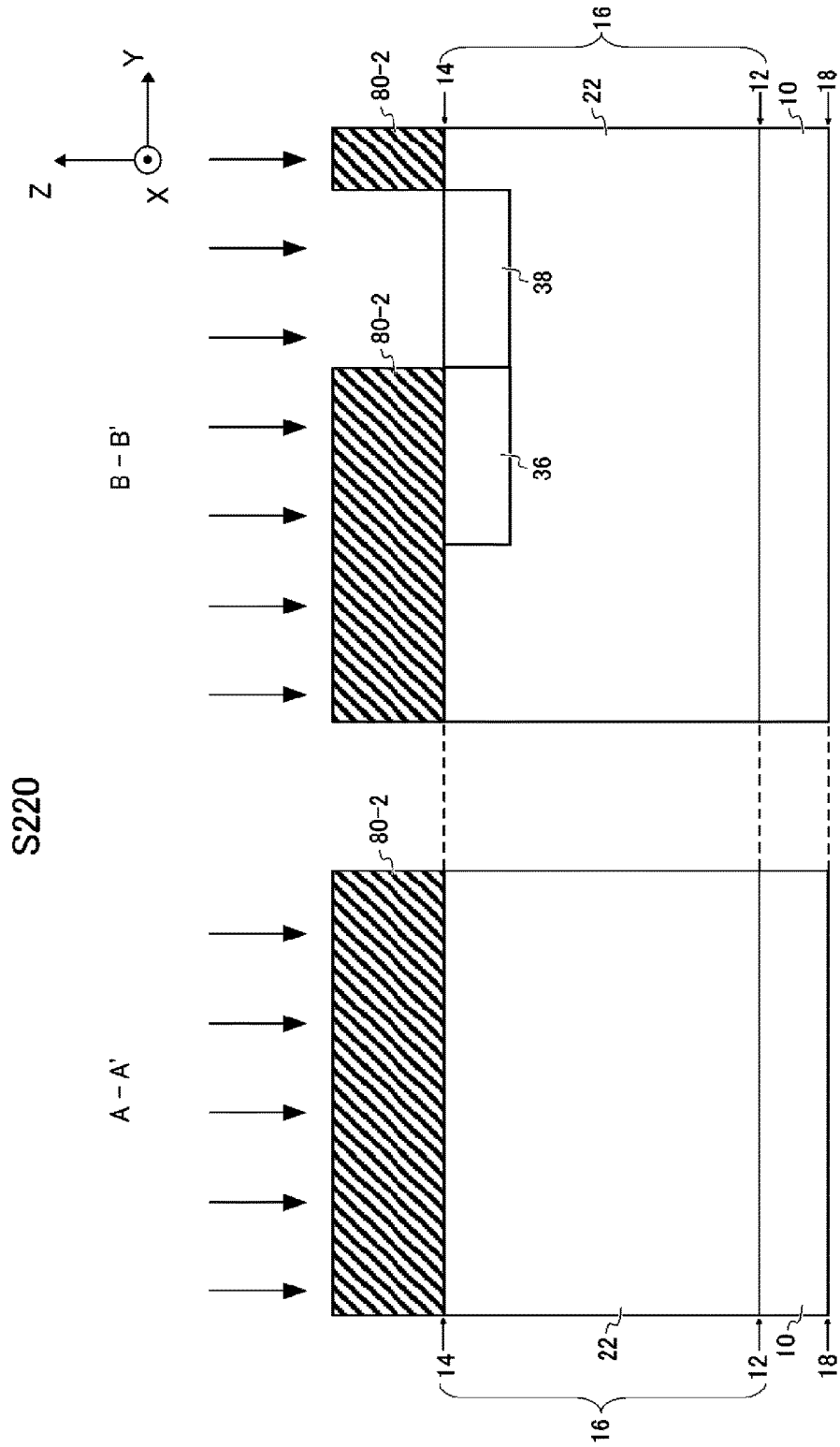

S270

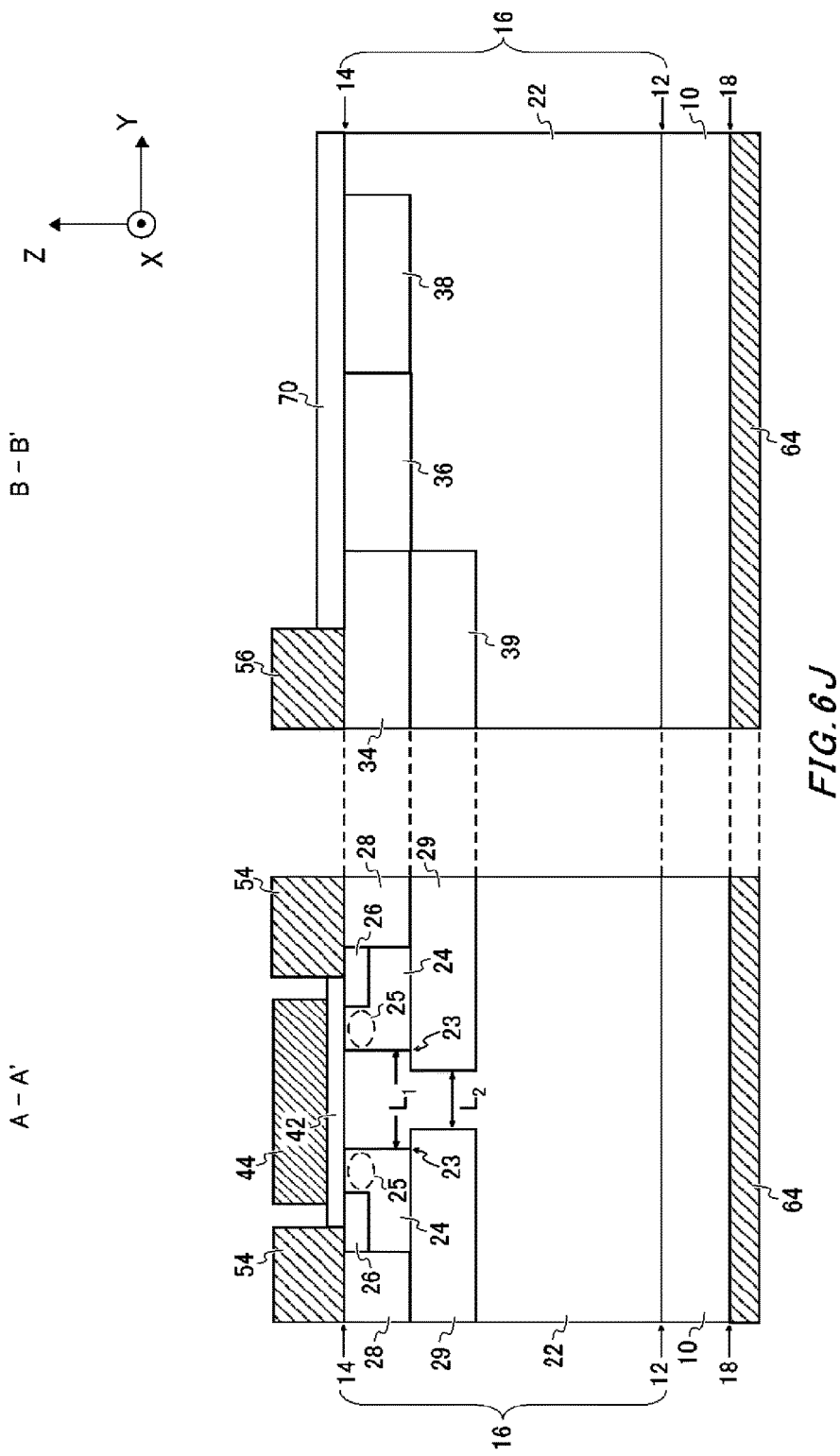

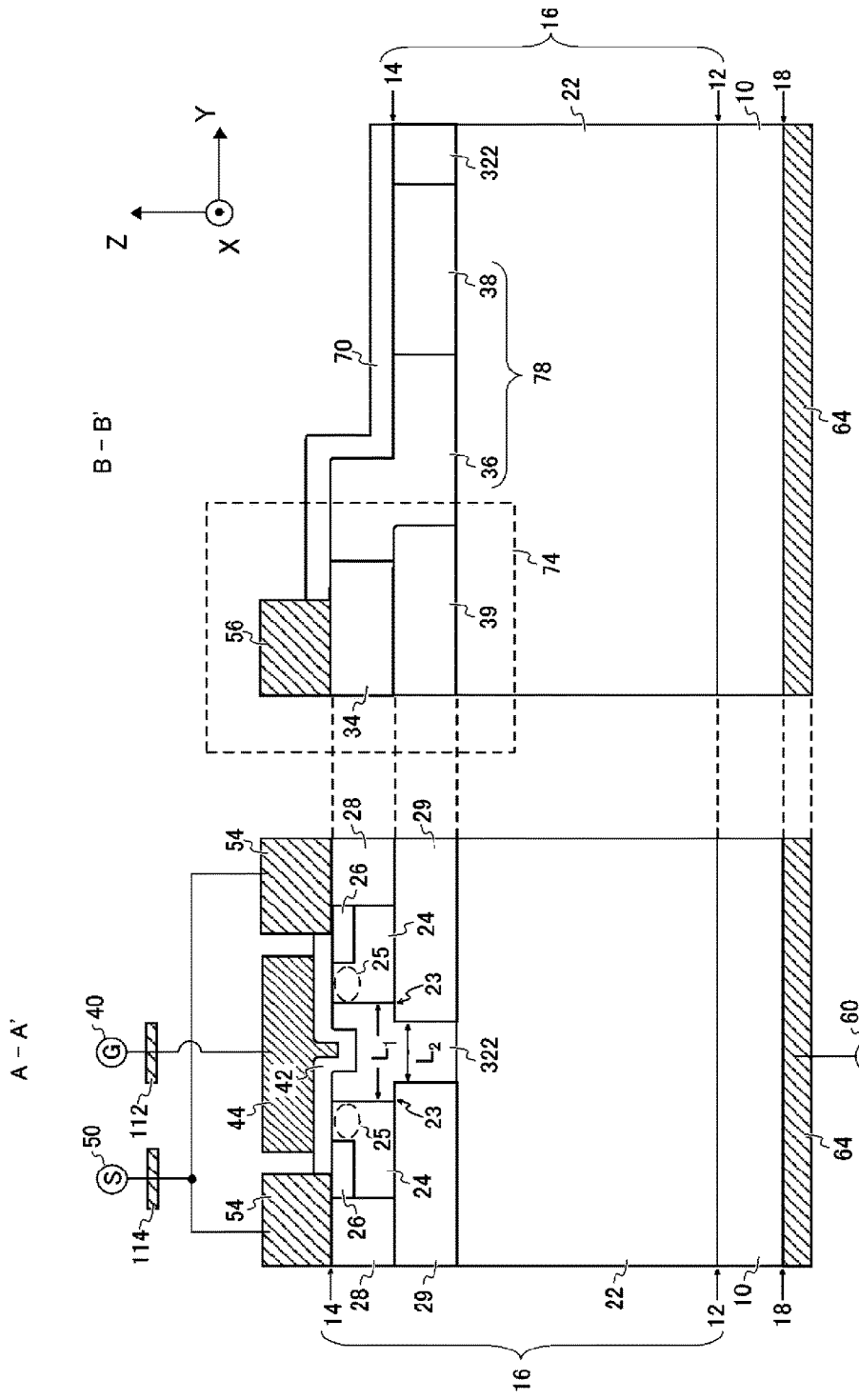

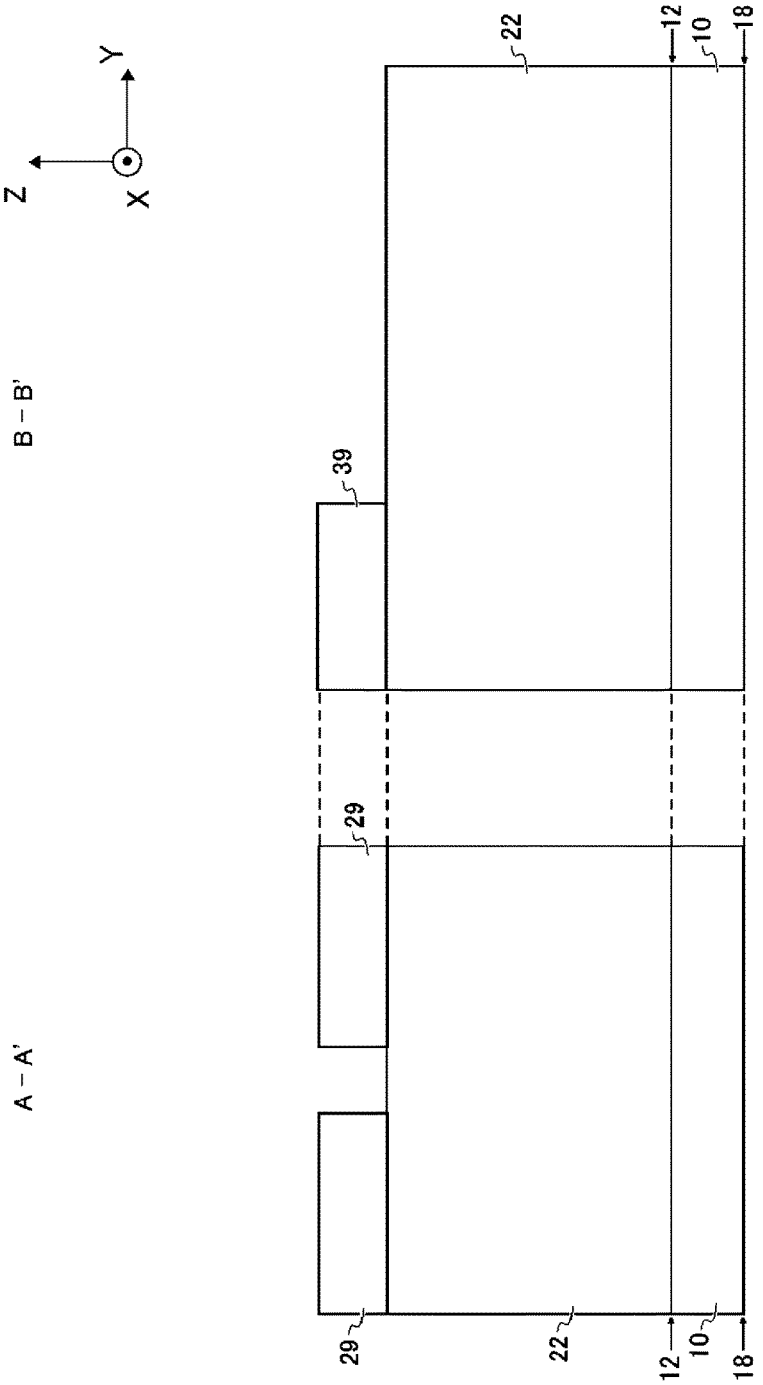

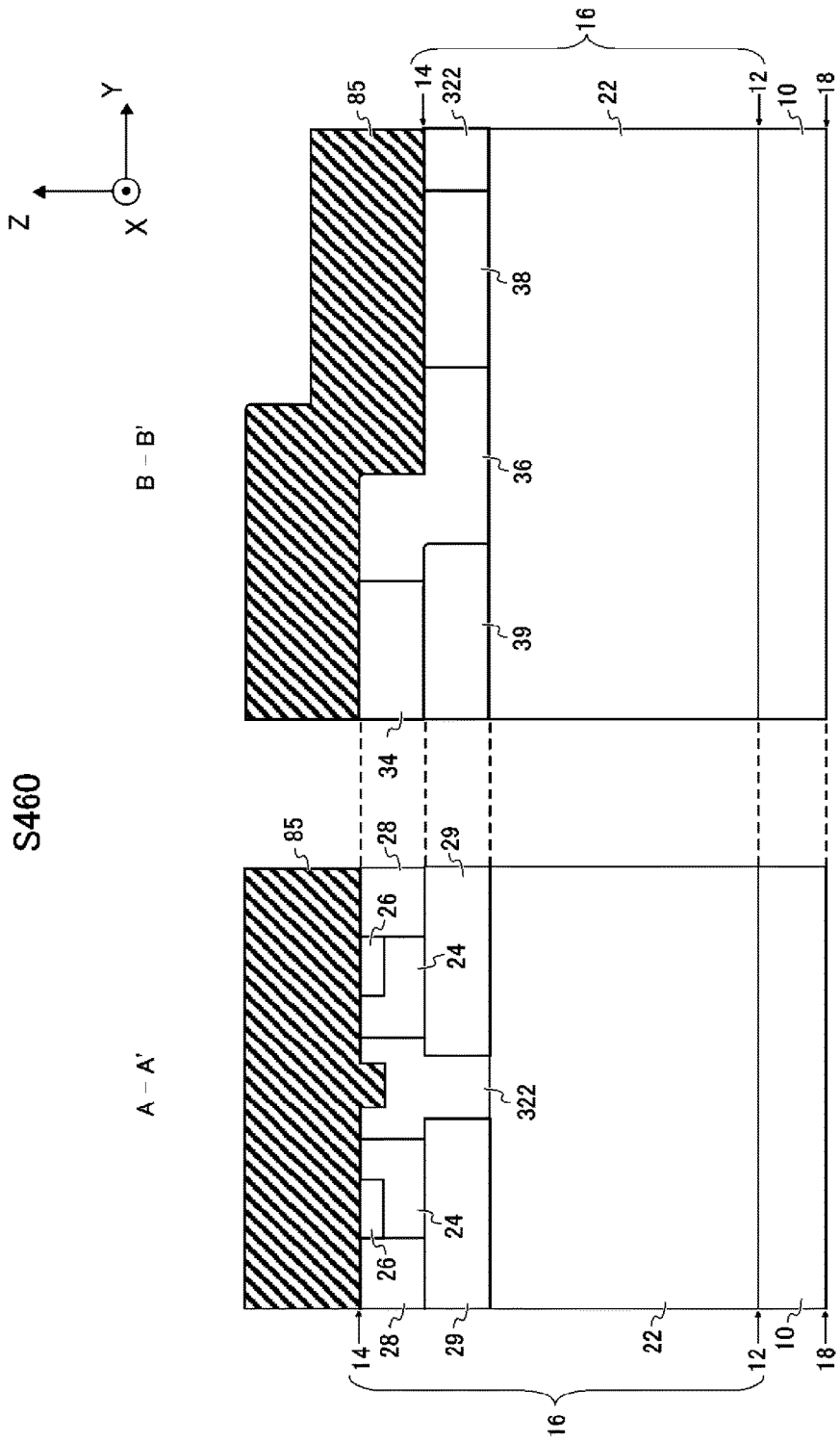

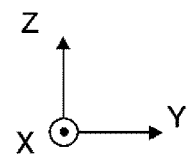
S470
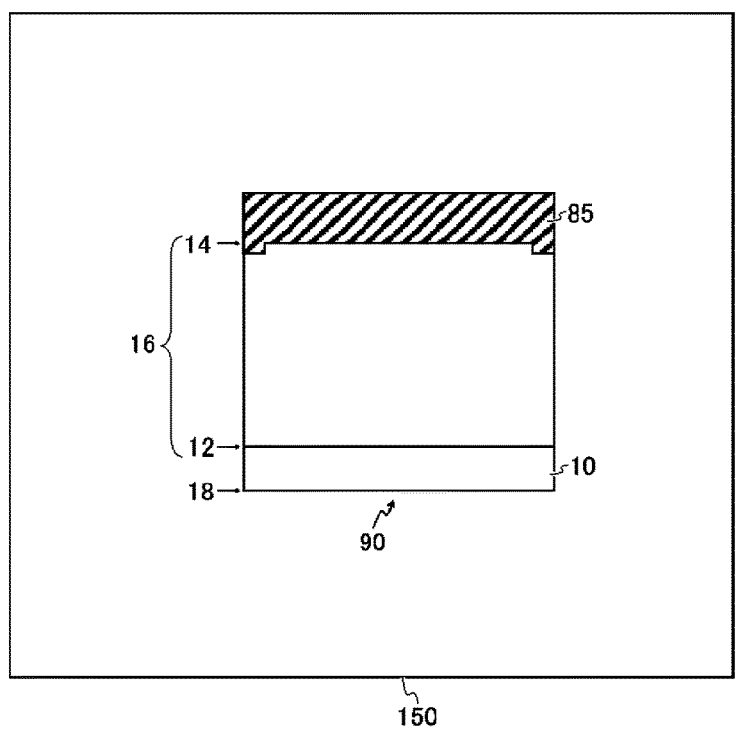
FIG.9J

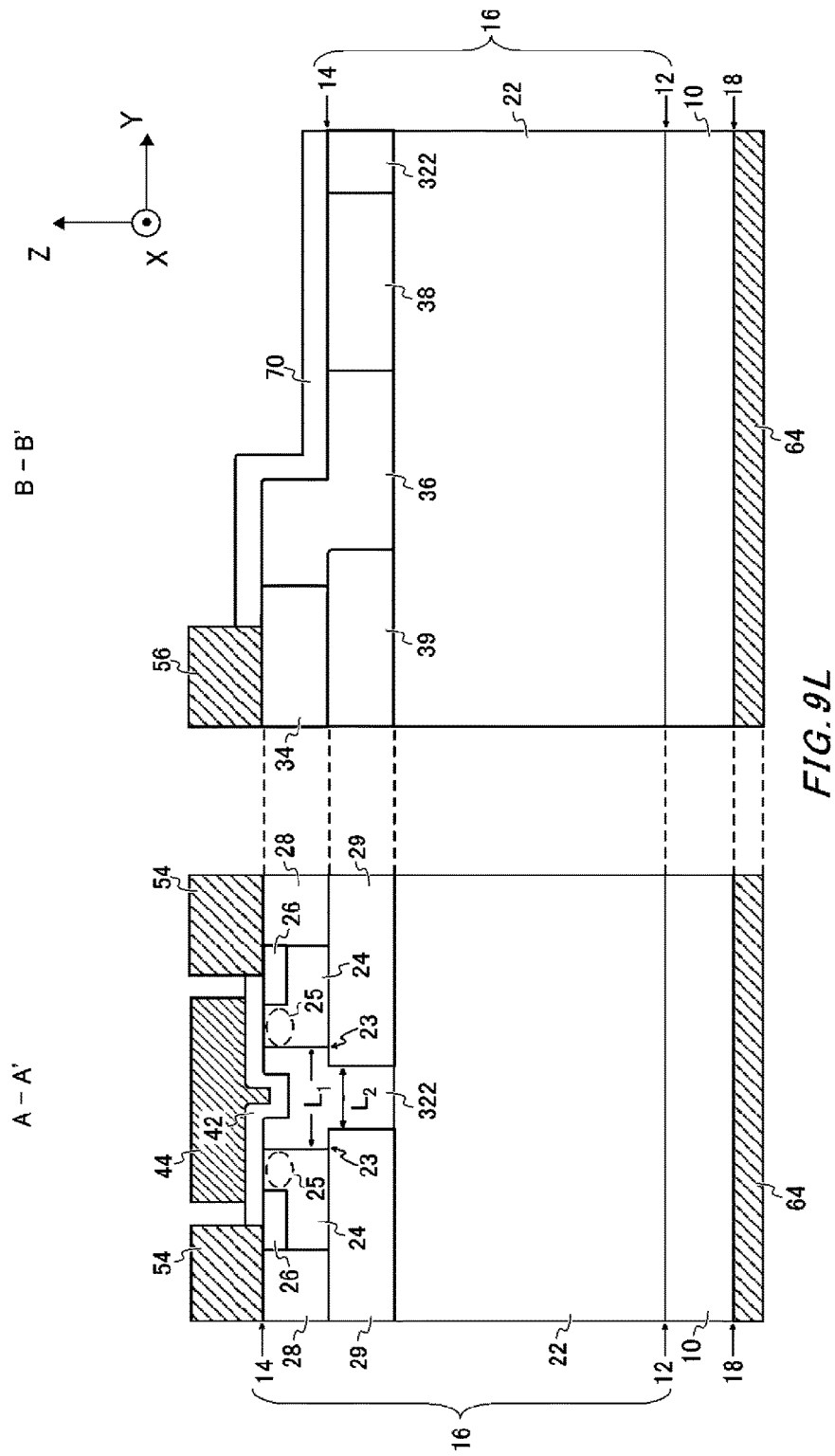

MANUFACTURING METHOD OF SEMICONDUCTOR DEVICE AND SEMICONDUCTOR DEVICE

The contents of the following Japanese patent application are incorporated herein by reference:
NO. 2016-136796 filed in JP on Jul. 11, 2016.

BACKGROUND

Technical Field

The present invention relates to a manufacturing method of a semiconductor device and a semiconductor device.

In the conventional art, a trench gate structure in a vertical MOSFET using GaN is formed by separating a p-type GaN layer using etching to form a mesa (see, for example, Tohru Oka et al., "Vertical GaN-based trench metal oxide semiconductor field-effect transistors on a free-standing GaN substrate with blocking voltage of 1.6 kV," Applied Physics Express, published 28 Jan. 2014, Volume 7, Number 2, 021002). Furthermore, in the conventional art, magnesium (Mg) ions implanted into a Group-III nitride-based compound are thermally diffused (see, for example, Japanese Patent Application Publication No. 2007-258578).

When the p-type GaN layer is subjected to etching, the region in the vicinity of the surface of the GaN layer, which is to serve as a channel forming region, is damaged. This may degrade the characteristics of the device. When the Mg ions are thermally diffused, the channel forming region cannot achieve a uniform concentration of Mg or impurities. This may cause variability in the gate threshold voltage $V_{th}$.

SUMMARY

A first aspect of the innovations herein provides a manufacturing method of a semiconductor device including a vertical MOSFET having a planar gate. The manufacturing method of a semiconductor device may include forming a n-type gallium nitride layer, and forming an impurity-implanted region. The n-type gallium nitride layer may be positioned on a gallium nitride monocrystalline substrate. The impurity-implanted region may be formed by ion-implanting impurities into the n-type gallium nitride layer, and the impurities may include at least one type selected from among magnesium, beryllium, calcium and zinc. The impurity-implanted region may contain the impurities at a uniform concentration in a direction parallel to a main surface of the gallium nitride monocrystalline substrate. At least part of the impurity-implanted region may serve as a channel forming region of the vertical MOSFET.

During the formation of the impurity-implanted region, the impurities may be ion-implanted into the n-type gallium nitride layer by accelerating the impurities with an energy of 10 keV or higher and 200 keV or lower depending on a depth of the impurity-implanted region and with a dosage being set to $1E+12$ $cm^{-2}$ or higher and $1E+14$ $cm^{-2}$ or lower.

The impurity-implanted region may contain the impurities at a concentration of $1E+16$ $cm^{-3}$ or higher and $1E+18$ $cm^{-3}$ or lower.

The manufacturing method of a semiconductor device may further include, subsequent to the formation of the n-type gallium nitride layer and prior to the formation of the impurity-implanted region, forming a high-concentration impurity region containing the impurities at a high concentration at a position deeper than the impurity-implanted region.

During the formation of the high-concentration impurity region, the impurities may be ion-implanted into the n-type gallium nitride layer by accelerating the impurities with an energy of 300 keV or higher and 800 keV or lower depending on a depth of the high-concentration impurity region and with a dosage being set to $1E+14$ $cm^{-2}$ or higher and $1E+15$ $cm^{-2}$ or lower.

The high-concentration impurity region may contain the impurities at a concentration of $1E+19$ $cm^{-3}$ or higher and $1E+20$ $cm^{-3}$ or lower.

According to a second aspect of the innovations herein, during the formation of the high-concentration impurity region, the high-concentration impurity region containing the impurities at a concentration of $1E+18$ $cm^{-3}$ or higher and $1E+20$ $cm^{-3}$ or lower may be epitaxially formed on the n-type gallium nitride layer.

The impurities may be magnesium.

The manufacturing method of a semiconductor device may further include forming a cap layer and performing annealing. The formation of the cap layer may be subsequent to the formation of the impurity-implanted region. The cap layer may be provided on and in direct contact with the impurity-implanted region. The performing of the annealing may be subsequent to the formation of the cap layer. During the performing of the annealing, the impurity-implanted region may be annealed at a temperature of 1100° C. or higher and 1400° C. or lower.

A third aspect of the innovations herein provides a semiconductor device including a vertical MOSFET having a planar gate. The semiconductor device may include a gallium nitride monocrystalline substrate, a gallium nitride layer, and an impurity-implanted region. The gallium nitride layer may be positioned on the gallium nitride monocrystalline substrate. The impurity-implanted region may be formed in the gallium nitride layer. The impurity-implanted region may contain impurities including at least one type selected from among magnesium, beryllium, calcium and zinc. The impurity-implanted region may contain the impurities at a uniform concentration in a direction parallel to a main surface of the gallium nitride monocrystalline substrate. At least part of the impurity-implanted region may serve as a channel forming region of the vertical MOSFET.

The summary clause does not necessarily describe all necessary features of the embodiments of the present invention. The present invention may also be a sub-combination of the features described above.

BRIEF DESCRIPTION OF THE DRAWINGS

FIG. 6B shows a step S220.

FIG. 6J shows a step S290.
FIG. 7 is a schematic view showing a cross-section along A-A' and a cross-section along B-B' of a vertical MOSFET 300 relating to a second embodiment.
FIG. 9C shows a step S414.
FIG. 9I shows a step S460.
FIG. 9J shows a step S470.
FIG. 9L shows a step S490.

DESCRIPTION OF THE EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
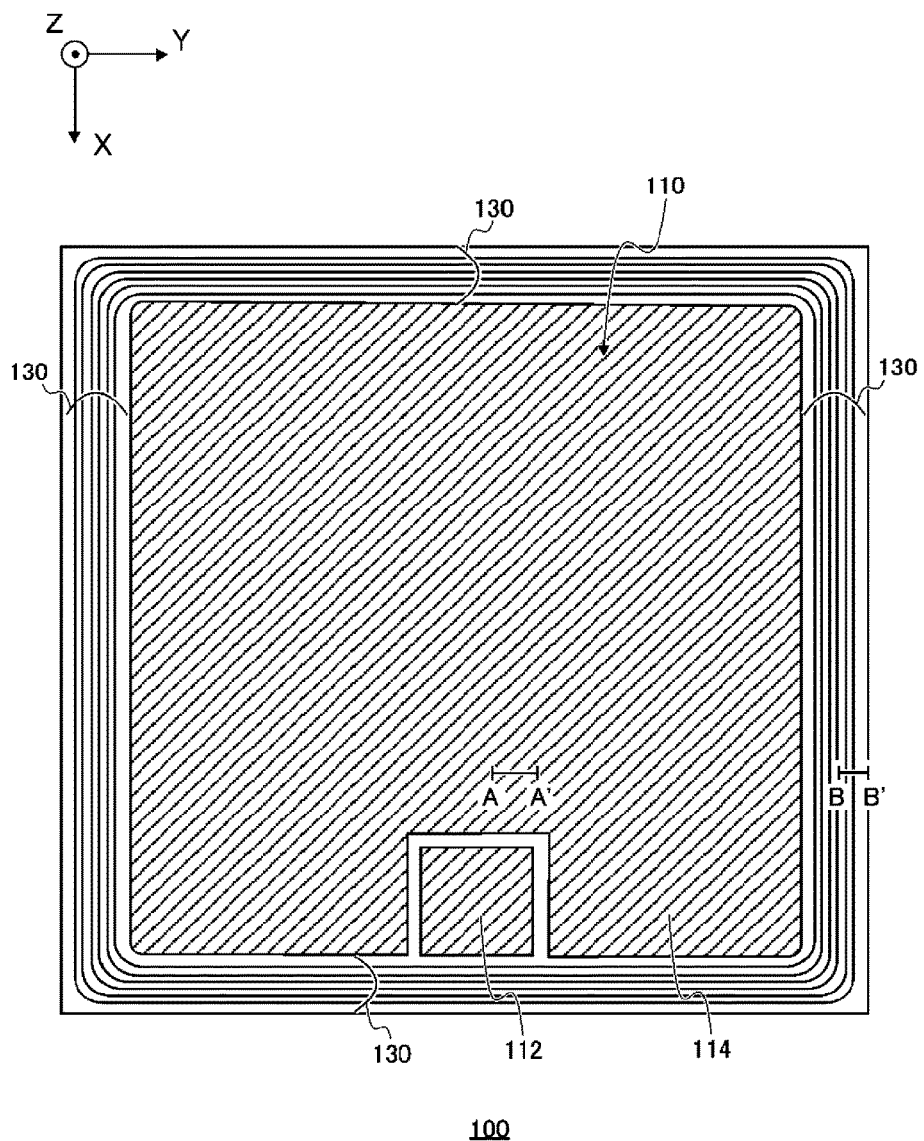
FIG. 1 is a schematic view showing an upper surface of a vertical MOSFET 100 relating to a first embodiment.

FIG. 1 is a schematic view showing the upper surface of a vertical metal oxide semiconductor field effect transistor (MOSFET) 100 relating to a first embodiment. FIG. 1 is also a planar view showing the vertical MOSFET 100 along the X-Y plane. In the present example, the X direction and the Y direction are perpendicular to each other, and the Z direction is perpendicular to the X-Y plane. The X, Y and Z directions form a so-called right-handed system.

In the present example, the terms such as "on" and "upper" mean the +Z direction and the termas such as "under" and "lower" mean the −Z direction. Here, the terms "on," "upper," "under" and "lower" are not necessarily associated with the vertical direction to the ground. On the contrary, the terms "on," "upper," "under" and "lower" are merely used conveniently to specify the relative positions of layers, films and the like.

In the present example, the vertical MOSFET 100 has an active region 110 and an edge termination structure region 130. The active region 110 has, on the upper surface thereof, a gate pad 112 and a source pad 114. The gate pad 112 and the source pad 114 are respectively electrode pads electrically connected to a gate electrode 44 and a source electrode 54, which will be described later.

The edge termination structure region 130 may include one or more of a guard ring structure, a field plate structure, and a junction termination extension (JTE) structure. The edge termination structure region 130 may be capable of preventing the electric fields from concentrating in the active region 110 by allowing the depletion layer generated in the active region 110 to expand until it reaches the edge termination structure region 130.

Figure 2:
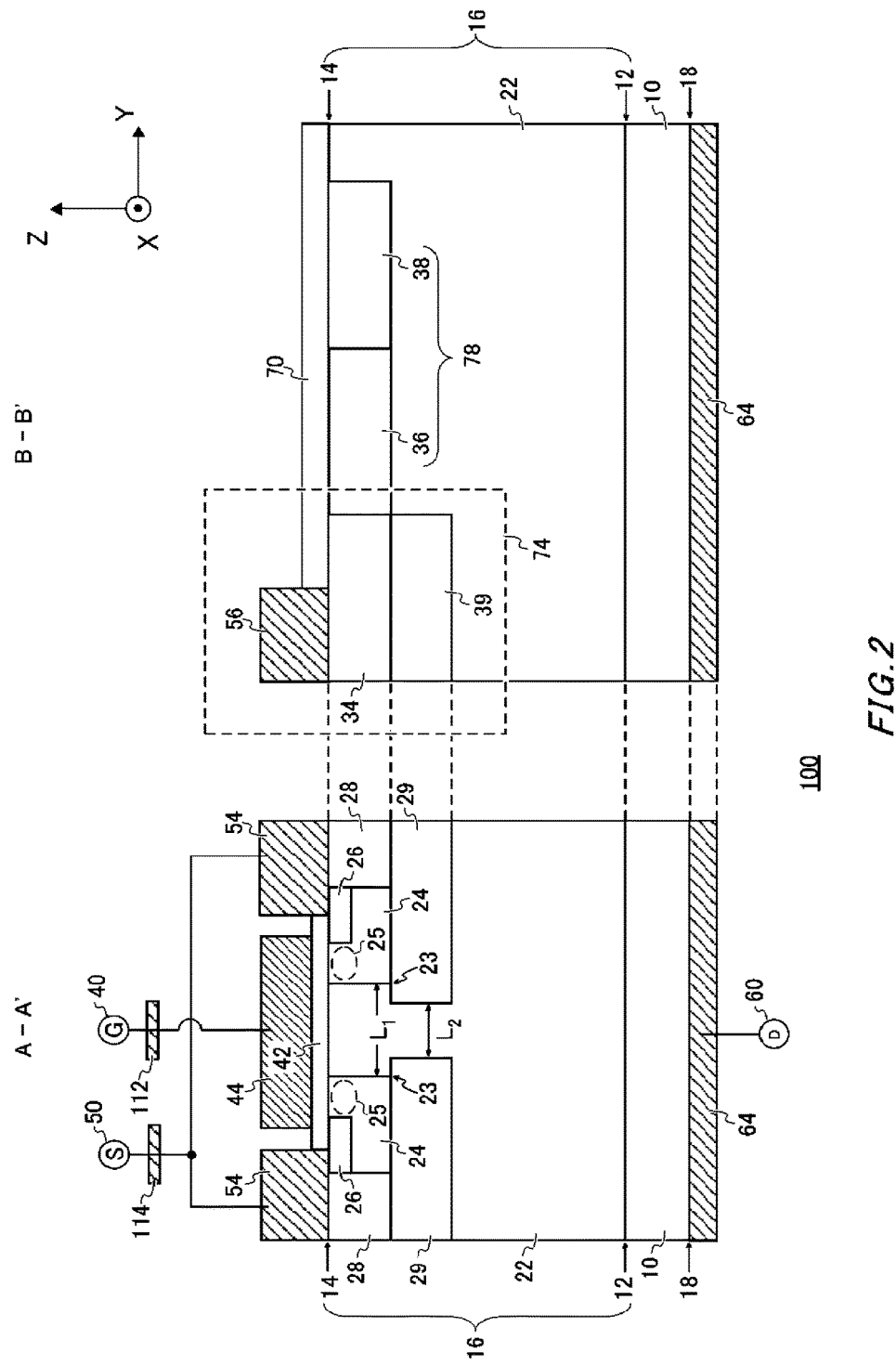
FIG. 2 is a schematic view showing a cross-section along A-A' and a cross-section along B-B' indicated in FIG. 1.

FIG. 2 is a schematic view showing a cross-section along A-A' and a cross-section along B-B' indicated in FIG. 1. The cross-section along A-A' shows a partial cross-section of the active region 110. The cross-section along B-B' shows a partial cross-section of the edge termination structure region 130.

The vertical MOSFET 100 of the present example includes a semiconductor such as gallium nitride (GaN). In the present example, the semiconductor of the vertical MOSFET 100 includes a GaN substrate 10, which is a gallium nitride monocrystalline substrate, and a GaN layer 16, which is a gallium nitride layer. The semiconductor, however, may further include one or more elements selected from aluminum (Al) and indium (In). In other words, the vertical MOSFET 100 may include a mixed-crystal semiconductor such as $Al_xIn_yGa_{1-x-y}N$ ($0 \le x < 1$, $0 \le y < 1$).

The n-type impurities for GaN may include one or more types of elements selected from among silicon (Si), germanium (Ge) and oxygen (O). In the present example, the n-type impurities can be Si or O. On the other hand, the p-type impurities for GaN may include one or more types of elements selected from among magnesium (Mg), calcium (Ca), beryllium (Be) and zinc (Zn). In the present example, the p-type impurities may be Mg. The reason why Mg is preferred will be described later.

Here, the above-mentioned p-type impurities have been proved to behave as p-type impurities in GaN if GaN is epitaxially grown while the source gas containing the above-mentioned p-type impurities are fed. It, however, has not been demonstrated that the above-mentioned p-type impurities can produce p-type GaN when the above-mentioned p-type impurities are ion-implanted into GaN. The inventors of the innovations herein have discovered that a MOSFET including an ion-implanted layer that is formed by ion-implanting the above-mentioned p-type impurities into GaN can be operational even if the ion-implanted layer does not have the p-type electrical characteristics. Therefore, the ion-implanted layer does not necessarily exhibit the p-type conductivity.

A-A' Cross-Section

The vertical MOSFET 100 of the present example includes, in the active region 110, a GaN substrate 10, a GaN layer 16, a gate insulator film 42, a gate electrode 44, a source electrode 54 and a drain electrode 64. The GaN substrate 10 includes $n^+$-type impurities. The superscript "+" or "−" added to the letter "n" or "p" is described here. The sign "+" means a higher carrier concentration than when not added, and the sign "−" means a lower carrier concentration than when not added.

In the present example, the GaN substrate 10 is a self-standing substrate having a threading dislocation density of less than $1E+7$ $cm^{-2}$. Since the GaN substrate 10 has a low dislocation density, the GaN layer 16, which is formed on the GaN substrate 10, can also have a lowered dislocation density. Furthermore, the use of a substrate with such few dislocations to form a large-area power device can reduce the leakage currents in the power device. Thus, non-defective power devices can be highly likely to be manufactured. In addition, the ion-implanted impurities can be prevented from diffusing deeply along the dislocations while annealing is performed.

The GaN layer 16 is provided on and in direct contact with the GaN substrate 10. In the present example, a boundary 12 is provided between the GaN layer 16 and the GaN substrate 10. The boundary 12 may be one of the main surfaces of the GaN substrate 10. In the present example, one of the main surfaces of the GaN substrate 10 that faces away from the boundary 12 is referred to as a back surface 18 of the GaN substrate 10. On the other hand, one of the main surfaces of the GaN layer 16 that faces away from the boundary 12 is referred to as a front surface 14 of the GaN layer 16.

An impurity-implanted region is provided in the GaN layer 16 on the front surface 14 side thereof. In the present example, the impurity-implanted region includes a Mg-doped region 24, an n⁺-type region 26, a high-concentration Mg-doped upper region 28 and a high-concentration Mg-doped lower region 29, which are formed within a predetermined range of depths from the front surface 14. The Mg-doped region 24, the n⁺-type region 26 and the high-concentration Mg-doped upper region 28 may be each at least partially exposed at the front surface 14. The Mg-doped region 24, the n⁺-type region 26, the high-concentration Mg-doped upper region 28 and the high-concentration Mg-doped lower region 29 may extend in the X direction (in the perpendicular direction in the plane of the drawing) to be arranged in stripes.

The high-concentration Mg-doped upper region 28 and the high-concentration Mg-doped lower region 29 have a higher Mg concentration than the Mg-doped region 24. The high-concentration Mg-doped lower region 29 is positioned at a deeper position (at a position closer to the back surface 18) than the Mg-doped region 24, the n⁺-type region 26 and the high-concentration Mg-doped upper region 28.

In the present example, the n-type layer 22 is continuously formed from the boundary 12 to the front surface 14. In other words, the n-type layer 22 of the present example is positioned between a pair of Mg-doped regions 24 and between a pair of high-concentration Mg-doped lower regions 29. The n-type layer 22 may serve as a drift layer in the vertical MOSFET 100.

In the present example, the n-type layer 22 may contain Si and/or O at a concentration of $1E+15$ cm$^{-3}$ or higher and $5E+16$ cm$^{-3}$ or lower. Here, the letter "E" represents the powers of 10. For example, the expression "1E+15" means $10^{15}$. The thickness of the n-type layer 22 (i.e., the length from the boundary 12 to the front surface 14) may vary depending on the breakdown voltage but can be, for example, several μm or more and several dozen μm or less.

The Mg-doped region 24 may serve as a base region. The Mg-doped region 24 may at least partially serve as a channel forming region 25. In the present example, a portion of the Mg-doped region 24 that is directly under the gate insulator film 42 and between the n-type layer 22 and the n⁺-type region 26 serves as the channel forming region 25.

As will be described later, the Mg-doped region 24 is provided within the GaN layer 16. Specifically speaking, the Mg-doped region 24 of the present example is formed by implanting Mg ions multiple times with varying implantation depths (referred to as the multiple-step implantation). This technique can form a more perfect box profile when compared with the case where the Mg ions are thermally diffused as disclosed in Japanese Patent Application Publication No. 2007-258578 cited above.

Stated differently, in the present example, the Mg-doped region 24 can have a uniform Mg concentration in the directions parallel and perpendicular to the main surfaces of the GaN substrate 10. In the present example, the Mg concentration of the Mg-doped region 24 is $1E+16$ cm$^{-3}$ or higher and $1E+18$ cm$^{-3}$ or lower.

The n⁺-type region 26 may serve as a source region. In the present example, the n⁺-type region 26 may contain Si and/or O at a concentration of $1E+20$ cm$^{-3}$ or higher. The n⁺-type region 26 may be provided within a range of depths of 0.05 μm or more and 0.5 μm or less from the front surface 14.

The high-concentration Mg-doped upper region 28 may be capable of lowering the contact resistance with the source electrode 54 and providing a hole drawing path when the vertical MOSFET 100 is turned off. In the present example, the high-concentration Mg-doped upper region 28 has a Mg concentration of $1E+19$ cm$^{-3}$ or higher and $1E+20$ cm$^{-3}$ or lower. The high-concentration Mg-doped upper region 28 may be provided within a range of depths of 0.05 μm or more and 0.5 μm or less from the front surface 14.

The high-concentration Mg-doped lower region 29 is provided under and in direct contact with the Mg-doped region 24. In the present example, the high-concentration Mg-doped lower region 29 has a Mg concentration of $1E+19$ cm$^{-3}$ or higher and $1E+20$ cm$^{-3}$ or lower. The high-concentration Mg-doped lower region 29 may be provided within a range of depths of 0.4 μm or more and 1.0 μm or less from the front surface 14.

In the present example, the high-concentration Mg-doped upper region 28 and the high-concentration Mg-doped lower region 29 are also formed by the multiple-step implantation. As a result, the high-concentration Mg-doped upper region 28 and the high-concentration Mg-doped lower region 29 can also achieve a uniform Mg concentration in the directions parallel and perpendicular to the main surfaces of the GaN substrate 10.

In the present example, a distance $L_2$ between a pair of high-concentration Mg-doped lower regions 29 is shorter than a distance $L_1$ between a pair of Mg-doped regions 24. Because of this, an L-shaped corner portion 23 is formed at the joint between the n-type layer 22, the Mg-doped region 24 and the high-concentration Mg-doped lower region 29.

When the gate electrode 44 is turned off (in the present example, when a predetermined negative potential or a potential of zero is applied to the gate electrode 44), the Mg-doped region 24, the high-concentration Mg-doped upper region 28 and the high-concentration Mg-doped lower region 29 have substantially the same potential as the source electrode 54. This can prevent the electric fields from concentrating at the gate insulator film 42 and accordingly prevent the gate insulator film 42 from being damaged when the GaN layer 16 breaks down.

The gate insulator film 42 is at least provided on and in direct contact with the Mg-doped region 24 and the n-type layer 22. The gate electrode 44 is provided on and in direct contact with the gate insulator film 42. In the present example, the gate electrode 44 is not a trench gate but a planar gate. As used herein, a trench gate means a gate structure in which the gate electrode 44 is provided by etching the Mg-doped region 24, which serves as the base region, and a planar gate means a gate structure in which the gate electrode 44 is provided not by etching the Mg-doped region 24 but formed on the Mg-doped region 24. The source electrode 54 is electrically connected to the n⁺-type region 26 and the high-concentration Mg-doped upper region 28. The drain electrode 64 is provided on and in direct contact with the back surface 18 of the GaN substrate 10. The gate insulator film 42, the gate electrode 44 and the source electrode 54 may extend in the X direction and be arranged in stripes.

The gate pad 112 is positioned between and electrically connected to a gate terminal 40 and the gate electrode 44. Likewise, the source pad 114 is positioned between and electrically connected to a source terminal 50 and the source electrode 54. The gate pad 112 and the source pad 114 may be electrically separated from each other by an interlayer insulating film. In the present example, however, the electrical separation is not described in detail and the gate pad 112 and the source pad 114 are schematically shown.

The gate terminal 40, the source terminal 50 and the drain terminal 60 are respectively indicated by circled letters D and S. For example, when the drain electrode 64 has a predetermined high potential and the source electrode 54 has a ground potential, application of a potential equal to or higher than the threshold voltage from the gate terminal 40 to the gate electrode 44 forms an electron inverting layer in the channel forming region 25, which causes currents to flow from the drain terminal 60 to the source terminal 50. Application of a potential lower than the threshold voltage to the gate electrode 44 erases the electron inverting layer in the channel forming region 25, which blocks the currents. In this manner, the currents flowing between the source terminal 50 and the drain terminal 60 in the vertical MOSFET 100 can be switched.

B-B' Cross-Section

The vertical MOSFET 100 of the present example includes, in the edge termination structure region 130, a GaN substrate 10, a GaN layer 16, an electrode 56, a protective film 70 and a drain electrode 64. The edge termination structure region 130 shares the GaN substrate 10 and the GaN layer 16 with the active region 110. The internal structure of the GaN layer 16, however, is different in the edge termination structure region 130 than in the active region 110.

The GaN layer 16 in the edge termination structure region 130 includes the n-type layer 22, a Mg-doped region 34, a Mg-doped region 36, a Mg-doped region 38 and a high-concentration Mg-doped lower region 39. The Mg-doped region 34 is provided on and in direct contact with the high-concentration Mg-doped lower region 39. The Mg-doped region 36 is in direct contact with the Mg-doped region 34 and positioned outside the Mg-doped region 34 in the X-Y plane. Likewise, the Mg-doped region 38 is in direct contact with the Mg-doped region 36 and positioned outside the Mg-doped region 36 in the X-Y plane.

Mg may be implanted into the Mg-doped region 34 in the same step as the step in which Mg is implanted into the Mg-doped region 24 in the active region 110. Stated differently, the Mg-doped regions 34 and 24 may have the same implantation depth and the same Mg concentration. Likewise, the high-concentration Mg-doped lower regions 29 and 39, into which Mg is implanted in the same step, may have the same implantation depth and the same Mg concentration.

In the present example, the edge termination structure region 130 includes a guard ring structure 74 and a JTE structure 78. The Mg-doped region 34, the high-concentration Mg-doped lower region 39 and the electrode 56 together constitute a single guard ring structure 74. The edge termination structure region 130 may include a plurality of guard ring structures 74 spaced away from each other.

The electrode 56 is provided on and in direct contact with the Mg-doped region 34. The electrode 56 may be shaped like a ring so as to surround the active region 110 in the X-Y plane. Here, the electrode 56 may be connected to the source electrode 54. The presence of the guard ring structure 74 assists the outward expansion of the depletion layer while the vertical MOSFET 100 is turned off.

The Mg-doped region 36 and the Mg-doped region 38 together constitute the JTE structure 78. In the present example, the Mg concentration of the Mg-doped region 38 is lower than the Mg concentration of the Mg-doped region 36. As the Mg concentration drops, the depletion is more likely to expand. In the present example, the outer portion has a relatively lower Mg concentration than the inner portion. This allows the depletion layer to easily expand outwardly while the vertical MOSFET 100 is turned off.

In the present example, the GaN layer 16 is not subjected to etching. Therefore, the GaN layer 16 does not have concave portions on the front surface 14. Accordingly, photolithography processes such as resist application and exposure are not obstructed by such unevenness. As a result, the present example is more advantageous than the case where the GaN layer 16 has unevenness in that microprocessing is easier.

The Mg concentration of the channel forming region 25 affects the gate threshold voltage. When the Mg-doped region 24 is epitaxially formed, the Mg concentration may vary in the range of 10% or higher and 20% or lower. On the other hand, when the Mg-doped region 24 is formed using ion implantation, the variability of the Mg concentration can be limited to within 3%. In the present example, the Mg-doped region 24 is formed using ion implantation. Thus, when compared with the case where the Mg-doped region 24 is epitaxially formed, the variability in the gate threshold voltage in the same wafer can be reduced.

Figure 3A:
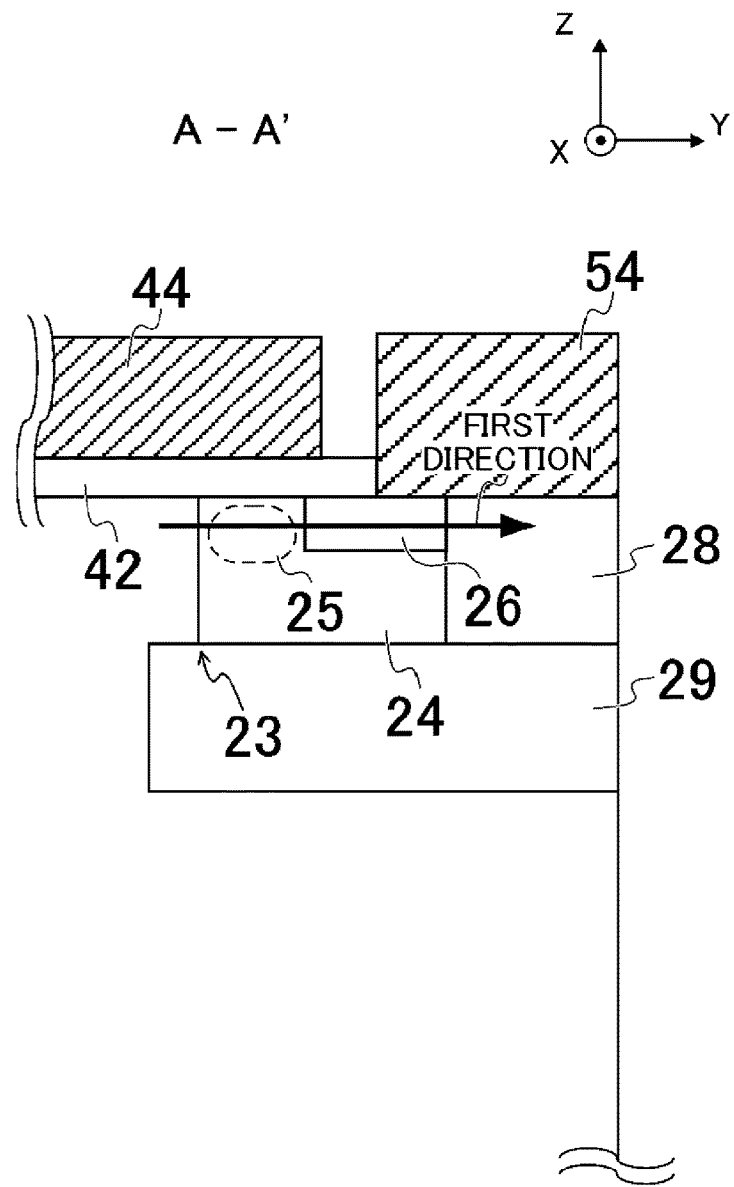
FIG. 3A illustrates a first direction.

FIG. 3A illustrates a first direction. In the present example, the first direction extends through the channel forming region 25 and is parallel to the main surfaces of the GaN substrate 10. Stated differently, the first direction extends through all of the n-type layer 22, the Mg-doped region 24, the n$^+$-type region 26 and the high-concentration Mg-doped upper region 28 and is parallel to the main surfaces of the GaN substrate 10. Here, the direction parallel to the main surfaces of the GaN substrate 10 may be parallel to the Y direction.

Figure 3B:
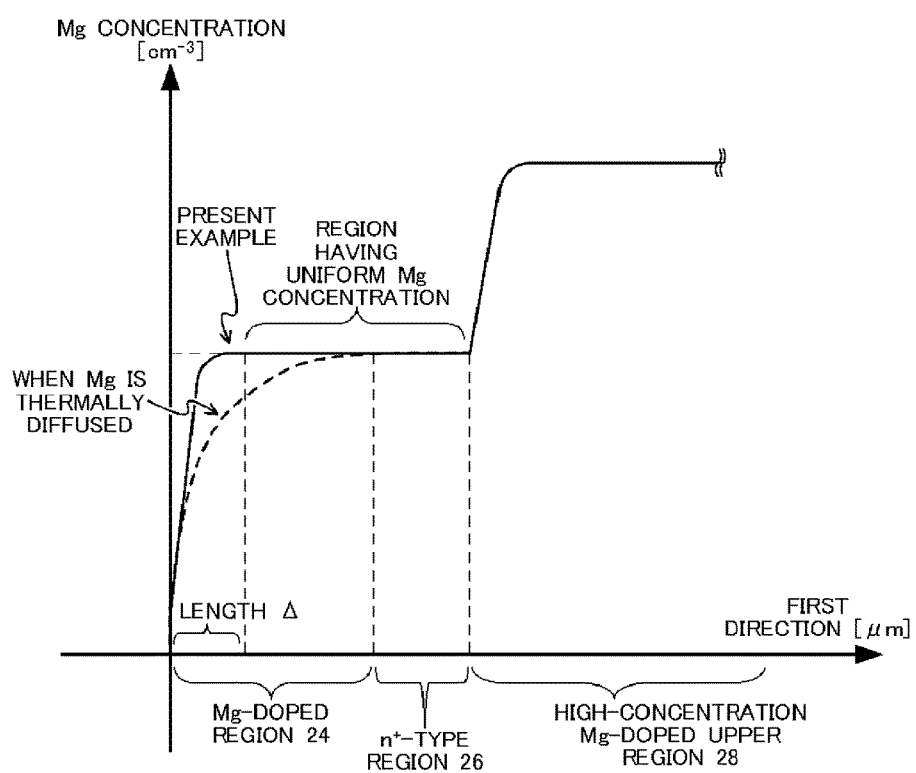
FIG. 3B shows a Mg concentration distribution in the first direction.

FIG. 3B shows the Mg concentration distribution in the first direction. The horizontal axis represents the length in the first direction [μm] and the vertical axis represents the Mg concentration [cm$^{-3}$]. The solid line represents the Mg concentration observed in the present example. On the other hand, the dashed line represents the Mg concentration observed when Mg is thermally diffused. Although the n$^+$-type region 26 also contains Mg, the n-type impurity concentration is higher than the Mg concentration in the n$^+$-type region 26. In addition, the Mg concentration observed when Mg is thermally diffused (the dashed line) is not illustrated for the high-concentration Mg-doped upper region 28.

When Mg is thermally diffused, the Mg concentration gradually drops in the opposite direction to the first direction. In the present example, on the contrary, the outer periphery of the Mg-doped region 24 is defined by ion implantation and a uniform Mg concentration can be thus achieved across a larger region in the first direction than when Mg is thermally diffused. In the present example, a non-uniform Mg concentration is only observed over a length Δ of 0.1 μm or more and 0.2 μm or less in the first direction. For the reasons stated above, the present example can easily realize a higher breakdown voltage and can accomplish more excellent switching characteristics than when the Mg-doped region 24 is formed using thermal diffusion.

In the present example, when the Mg-doped region 24 has a uniform concentration in the first direction, the same concentration can be observed over 10% or higher of the length of the channel forming region 25 in the first direction (i.e., the length in the Y direction) or can be observed over half or more of the length of the channel forming region 25 in the first direction. Here, the same concentration may allow fluctuation of +−1.5% or less from a predetermined concentration value. The length of the channel forming region 25 in the Y direction may be 0.5 μm or more and 2 μm or less, 0.5 μm or more and 1 μm or less, or 1 μm or more and 2 μm or less.

Figure 4A:
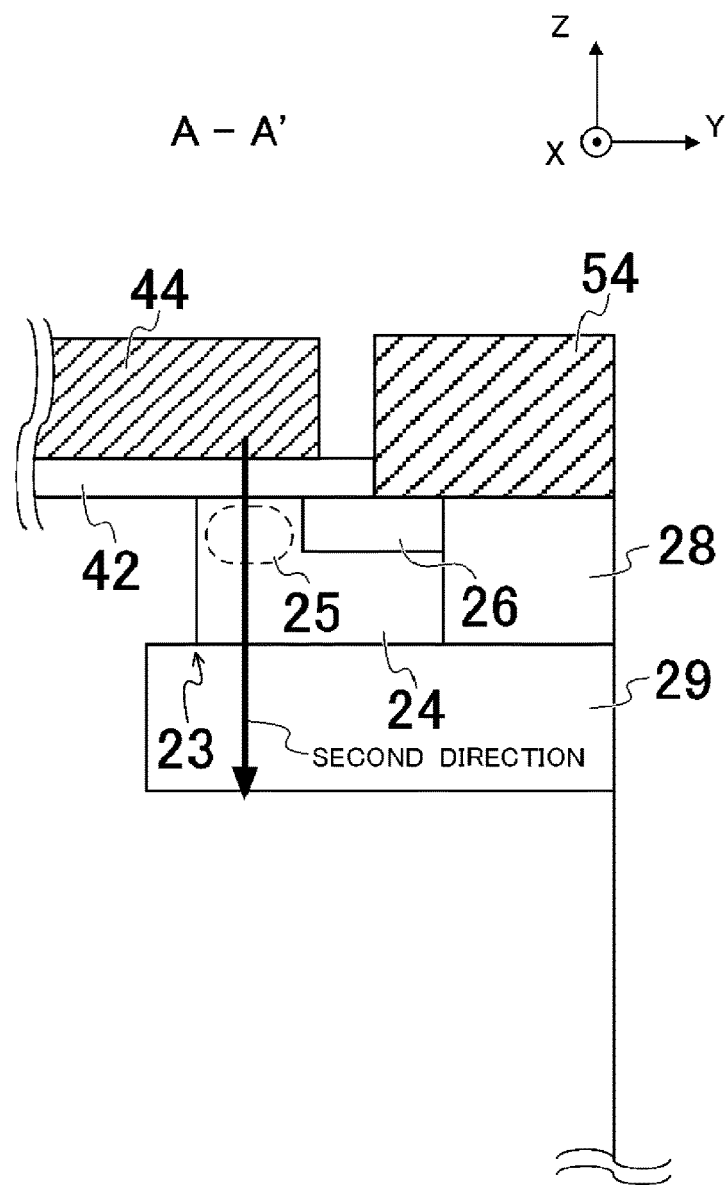
FIG. 4A illustrates a second direction.

FIG. 4A illustrates a second direction. In the present example, the second direction extends through the channel forming region 25 and is perpendicular to the main surfaces of the GaN substrate 10. Stated differently, the second direction extends through the Mg-doped region 24 and the high-concentration Mg-doped lower region 29 and is perpendicular to the main surface of the GaN substrate 10. Here, the direction perpendicular to the main surface of the GaN substrate 10 may be parallel to the Z direction.

Figure 4B:
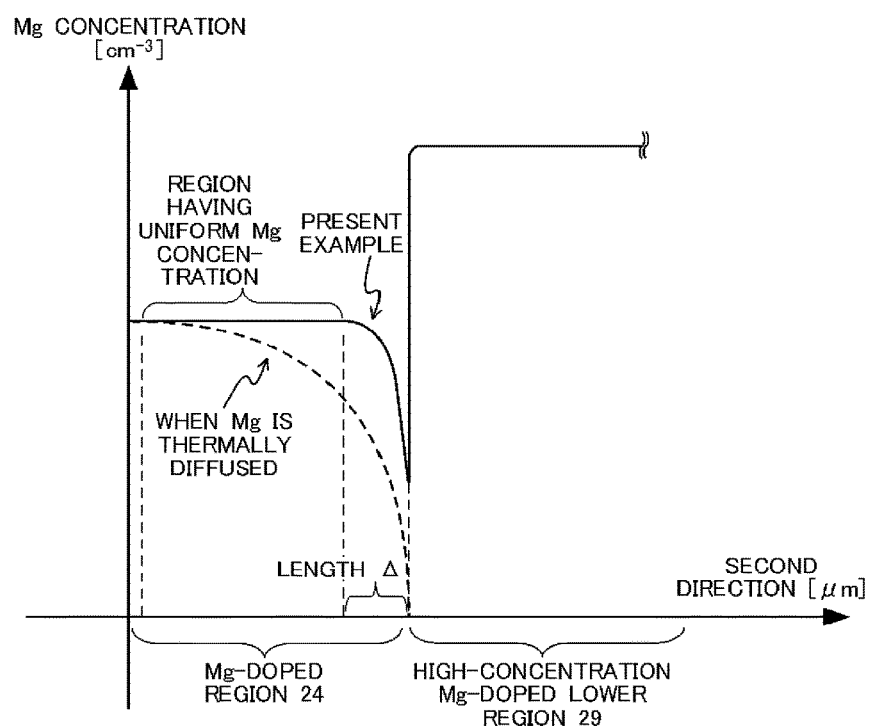
FIG. 4B shows a Mg concentration distribution in the second direction.

FIG. 4B illustrates the Mg concentration distribution in the second direction. The horizontal axis represents the length in the second direction [μm] and the vertical axis represents the Mg concentration [$cm^{-3}$]. The solid line represents the Mg concentration observed in the present example. On the other hand, the dashed line represents the Mg concentration observed when Mg is thermally diffused. In addition, the Mg concentration observed when Mg is thermally diffused (the dashed line) is not illustrated for the high-concentration Mg-doped lower region 29.

When Mg is thermally diffused, the Mg concentration gradually drops in the second direction as moved away from the front surface 14. Specifically speaking, the Mg concentration at the end of the Mg-doped region 24 in the second direction is one digit lower than the Mg concentration at the front surface 14. In the present example, on the contrary, the outer periphery of the Mg-doped region 24 is defined by the multiple-step implantation and a uniform Mg concentration can be thus achieved across a larger region than when Mg is thermally diffused. In the present example, a non-uniform Mg concentration is only observed over a length Δ in the second direction of, or within a range of depths of 0.1 μm or more and 0.2 μm or less from the lower end of the Mg-doped region 24.

In the present example, when the Mg-doped region 24 has the same concentration in the second direction, the same concentration can be observed over 10% or higher of the length of the Mg-doped region 24 in the second direction (i.e., the length in the Z direction) or can be observed over half or more of the length of the Mg-doped region 24 in the second direction. Here, the same concentration may allow fluctuation of +−1.5% or less from a predetermined concentration value. The length of the Mg-doped region 24 in the Z direction may be within a range of depths of 0.05 μm or more and 0.3 μm or less from the front surface 14.

According to the present embodiment, the concentration distribution of the Mg-doped region 24 is regulated by employing ion implantation in place of thermal diffusion as described above. Therefore, it is not necessary to perform etching on the Mg-doped region 24, which is designed to serve as the channel forming region 25. In addition, the present embodiment can achieve a more uniform Mg concentration in the Mg-doped region 24 in the first and second directions than when thermal diffusion is employed. Thus, the variability in the gate threshold voltage $V_{th}$ can be reduced.

Figure 5:
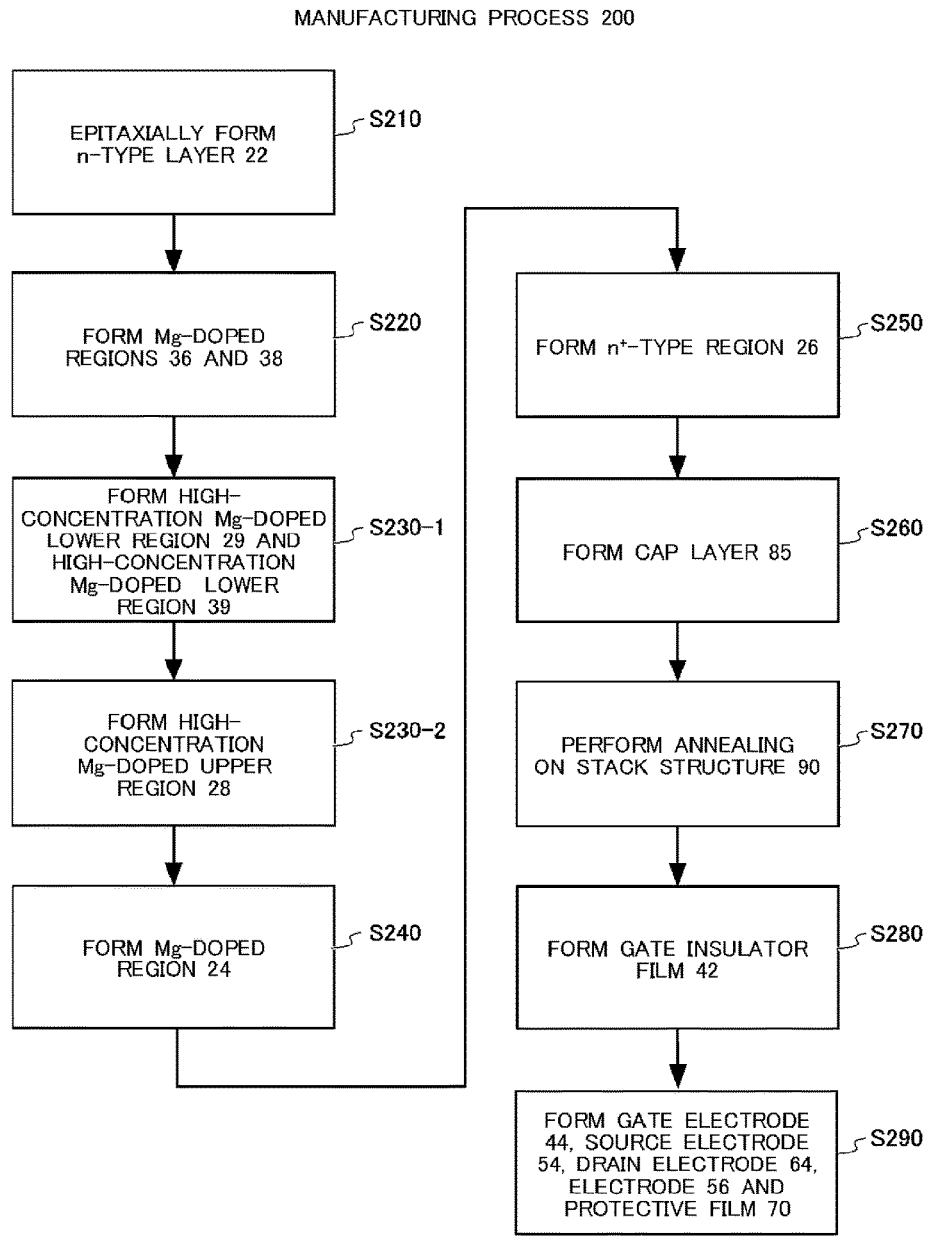
FIG. 5 is a flow chart showing a manufacturing process 200 of the vertical MOSFET 100.

FIG. 5 is a flow chart showing a manufacturing process 200 of the vertical MOSFET 100. The manufacturing process 200 of the present example proceeds in the order from the step S210 to the step S290. The manufacturing process 200 of the present example includes a step of forming the n-type layer 22 (step S210), a step of forming the Mg-doped regions 36 and 38 (step S220), a step of forming the high-concentration Mg-doped lower regions 29 and 39 (step S230-1) and a step of forming the high-concentration Mg-doped upper region 28 (step S230-2), a step of forming the Mg-doped region 24 (step S240), a step of forming the $n^+$-type region 26 (step S250), a step of forming a cap layer 85 (step S260), a step of performing annealing on a stack structure 90 (step S270), a step of forming the gate insulator film 42 (step S280), and a step of forming the gate electrode 44 and the like (step S290).

Figure 6A:
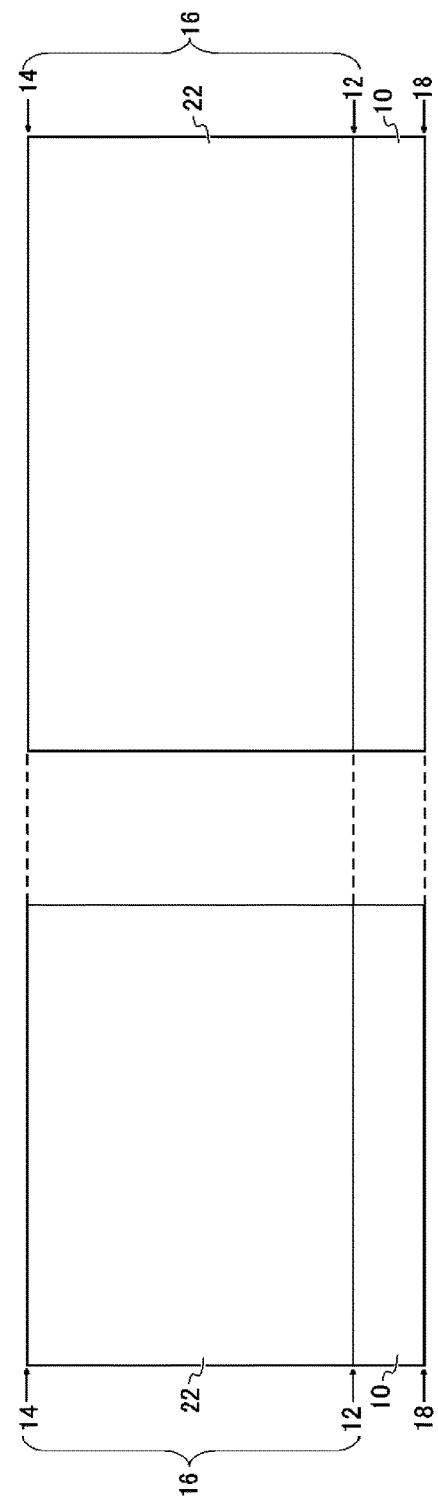
FIG. 6A shows a step S210.

FIG. 6A shows the step S210. In the step S210 of the present example, the n-type layer 22 is epitaxially formed on the GaN substrate 10 using metal organic chemical vapor deposition (MOCVD), halide vapor phase epitaxy (HYPE) or the like. The epitaxially-formed n-type layer 22 may contain Si at a concentration of $1E+15$ $cm^{-3}$ or higher and $5E+15$ $cm^{-3}$ or lower.

FIG. 6B shows the step S220. In the step S220 of the present example, the Mg-doped regions 36 and 38 are sequentially formed using ion implantation. In the present example, the Mg-doped region 36 is formed through a mask 80-1 (not shown). Subsequently, the Mg-doped region 38 is formed through a mask 80-2. The masks 80 may be made of silicon dioxide ($SiO_2$) that can be selectively removed with respect to the GaN layer 16.

While the ion implantation is performed, the temperature of the GaN substrate 10 and the n-type layer 22 may be set equal to the room temperature. This may reduce the Ga vacancies and the compound defects of the Ga and N vacancies in the GaN layer 16. The same effects can be similarly produced when other types of ions are implanted. The accelerating voltage for the ion implantation may vary depending on the implantation depth. As the accelerating voltage increases, the energy of the impurities can increase. Therefore, as the accelerating voltage increases, the implantation depth increases.

In the present example, Mg is ion-implanted into the n-type layer 22 using the multiple-step implantation with the accelerating voltage being set to 10, 20, 40, 70, 110, 150 and 200 keV and the dosage being set to $1E+12$ $cm^{-2}$ or higher and $1E+14$ $cm^{-2}$ or lower. By setting the dosage lower in the Mg-doped region 38 than in the Mg-doped region 36, the Mg concentration may be lower in the Mg-doped region 38 than in the Mg-doped region 36.

Figure 6C:
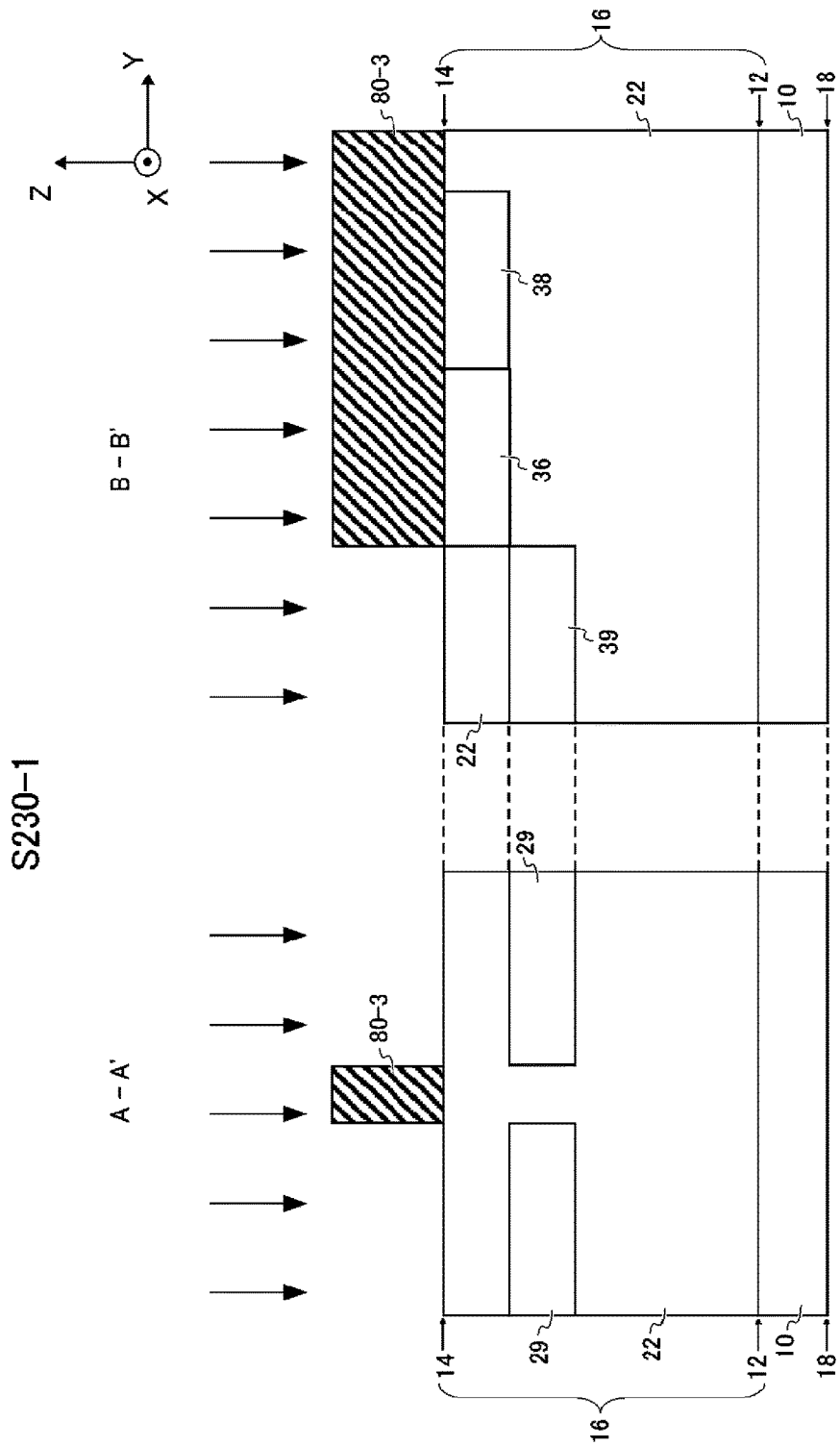
FIG. 6C shows a step S230-1.

FIG. 6C shows the step S230-1. In the step S230-1 of the present example, the high-concentration Mg-doped lower region 29 in the active region 110 and the high-concentration Mg-doped lower region 39 in the edge termination structure region 130 are simultaneously formed using ion implantation. In the present example, Mg is ion-implanted into the n-type layer 22 by performing the multiple-step implantation through a mask 80-3 with the accelerating voltage being set to 300 keV or higher and 800 keV or lower and the dosage being set to $1E+14$ $cm^{-2}$ or higher and $1E+15$ $cm^{-2}$ or lower. In order to position the high-concentration Mg-doped lower region 29 lower than the Mg-doped region 24, the upper limit of the accelerating voltage may be 400, 500, 600 or 700 keV.

Figure 6D:
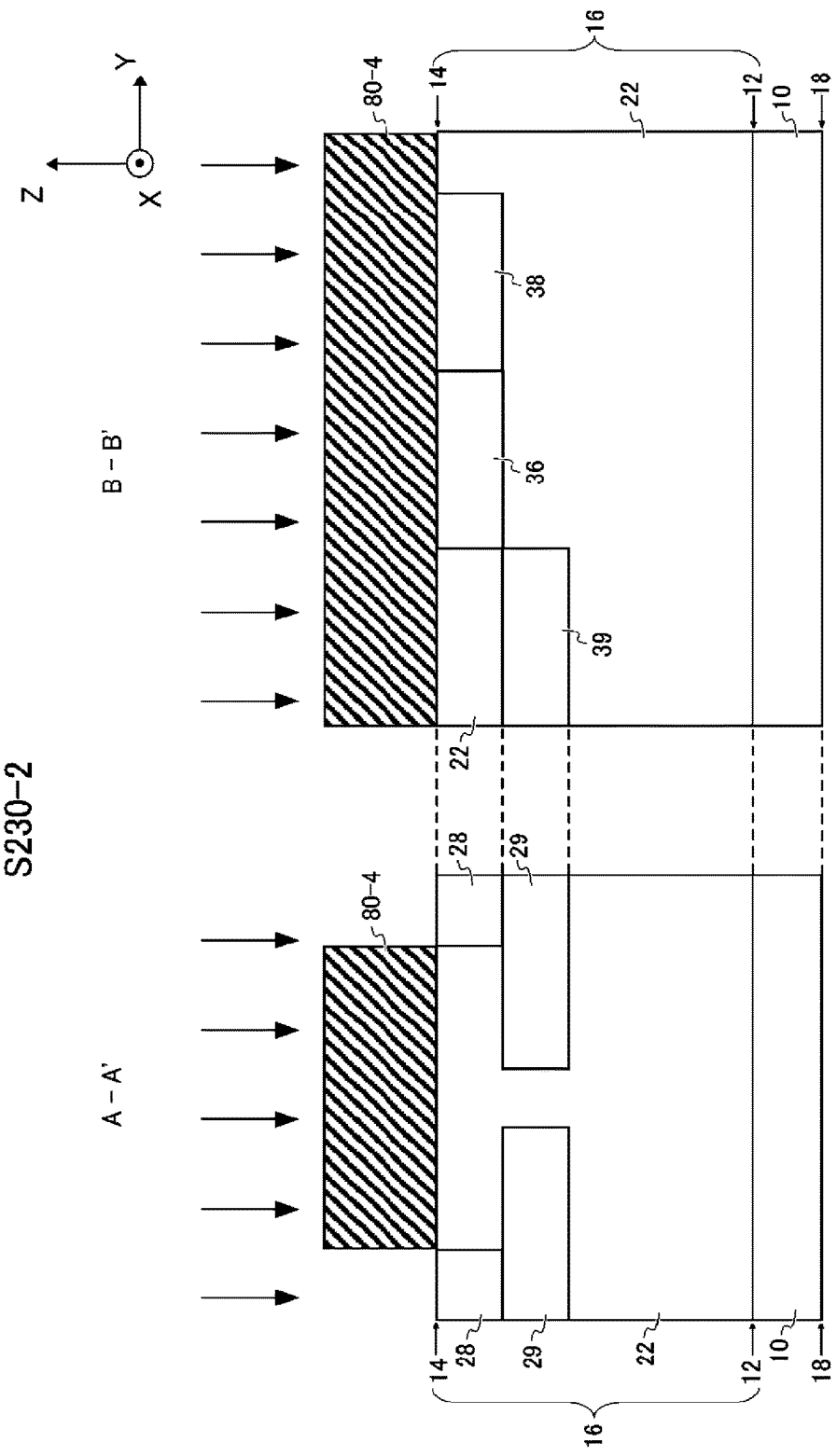
FIG. 6D shows a step S230-2.

FIG. 6D shows the step S230-2. The step S230-2 follows the step S230-1 in the present example. In the step S230-2 of the present example, the high-concentration Mg-doped upper region 28 is formed by ion implantation. In the present example, Mg is ion-implanted into the n-type layer 22 by performing the multiple-step implantation through a mask 80-4 with the accelerating voltage being set to 10, 20, 40, 70, 110, 150 and 200 keV and the dosage being set to $1E+14$ $cm^{-2}$ or higher and $1E+15$ $cm^{-2}$ or lower.

Figure 6E:
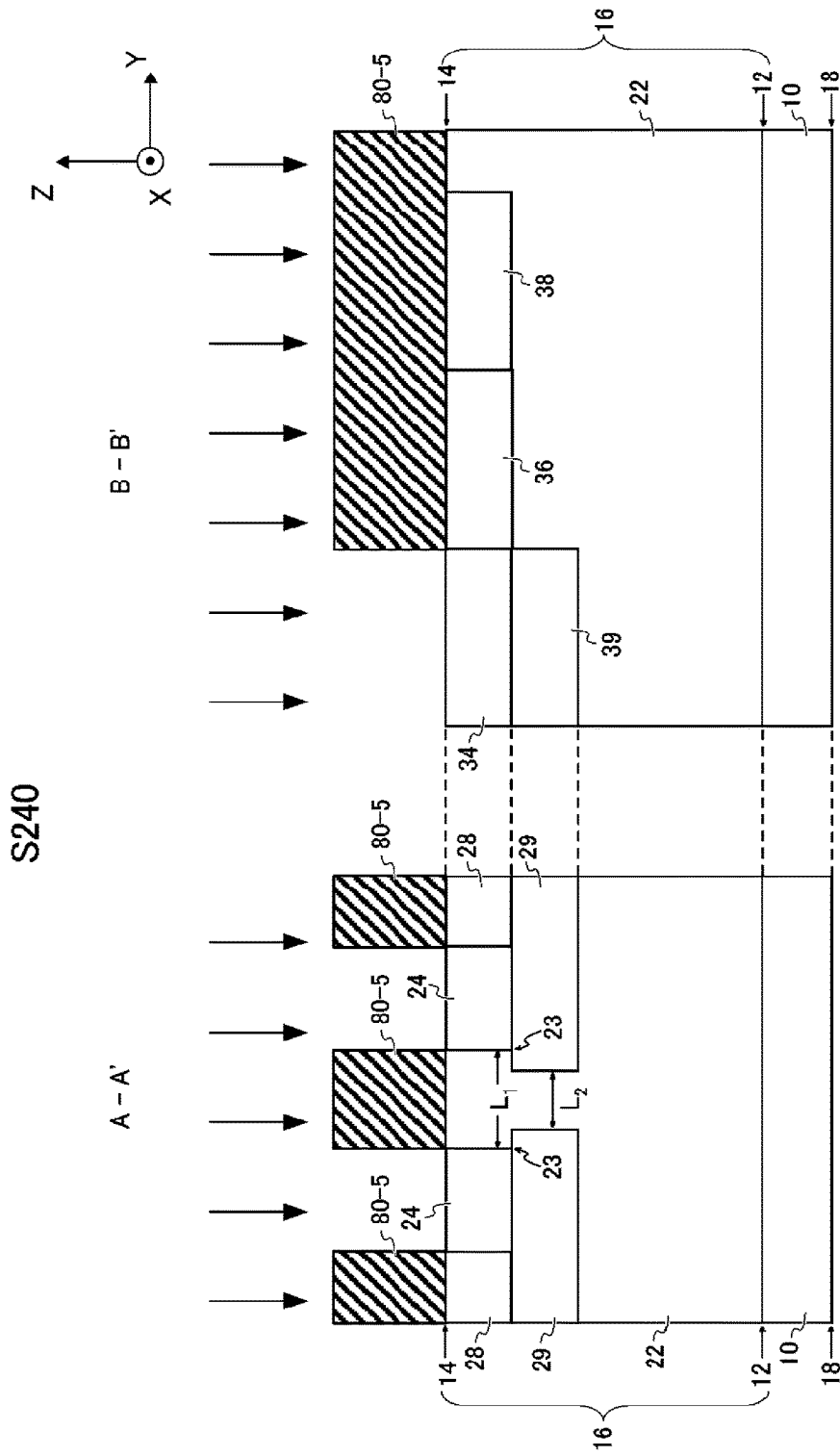
FIG. 6E shows a step S240.

FIG. 6E shows the step S240. In the step S240 of the present example, the Mg-doped region 24 in the active region 110 and the Mg-doped region 34 in the edge termination structure region 130 are simultaneously formed using ion implantation. In the present example, Mg is ion-implanted into the n-type layer 22 by performing the multiple-step implantation through a mask 80-5 with the accelerating voltage being set to 10, 20, 40, 70, 110, 150 and 200 keV and the dosage being set to $1E+12$ $cm^{-2}$ or higher and $1E+14$ $cm^{-2}$ or lower.

In the step S240 of the present example, the accelerating voltage is set to 10 keV or higher and 200 keV or lower. In the present example, 10 keV is the lower limit of the accelerating voltage required to achieve the shallowest implantation depth. In the present example, 200 keV is the upper limit of the accelerating voltage required to implant the Mg ions at the depth of the boundary between the Mg-doped region 24 and the high-concentration Mg-doped lower region 29, and between the Mg-doped region 34 and the high-concentration Mg-doped lower region 39. The upper limit may not be necessarily 200 keV in order to achieve a predetermined Mg concentration in the channel forming region 25. In the present example, the upper limit may be 150, 160, 170, 180 or 190 keV.

Figure 6F:
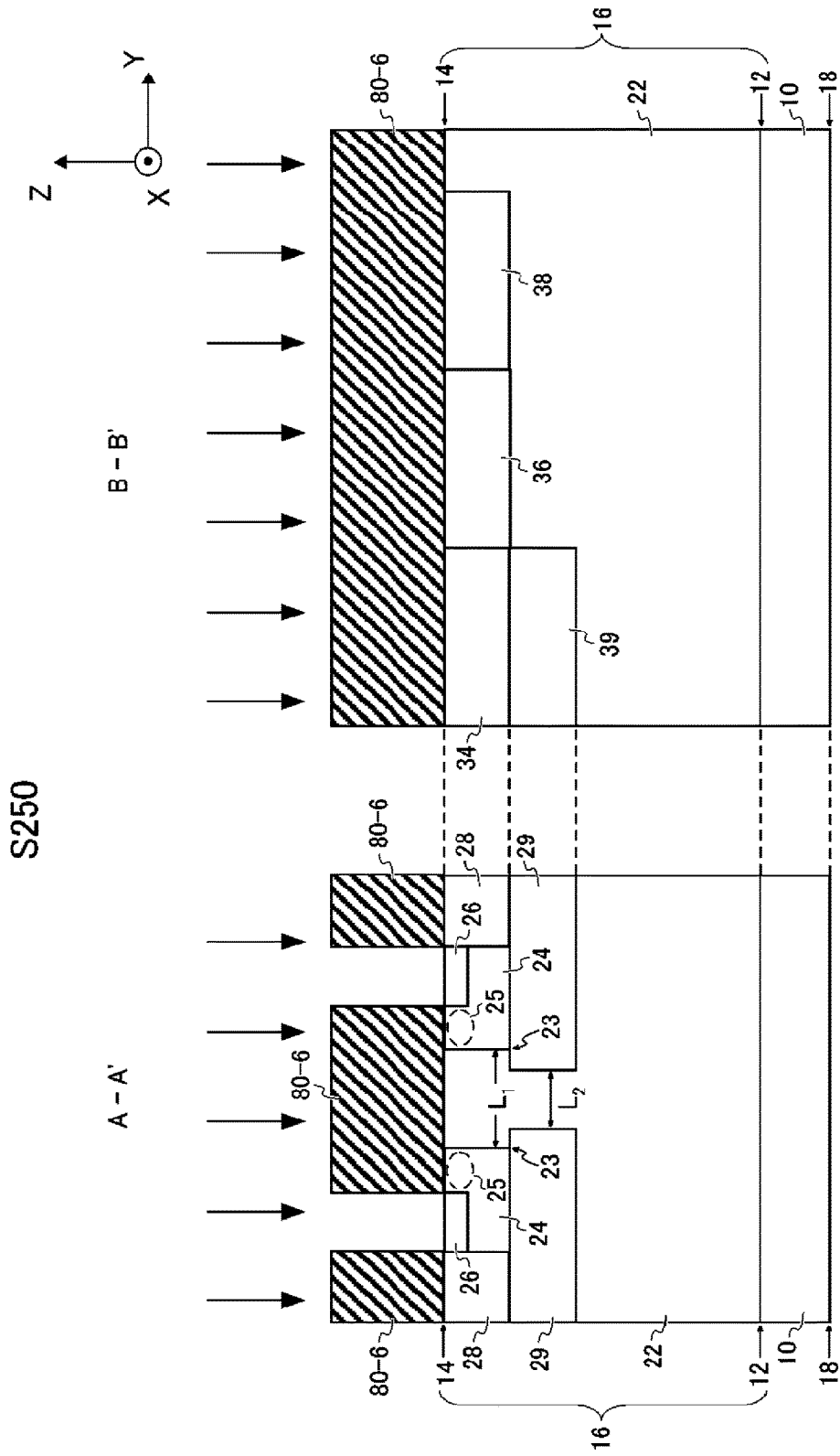
FIG. 6F shows a step S250.

FIG. 6F shows the step S250. In the step S250 of the present example, the $n^+$-type region 26 is formed using ion implantation. In the present example, Si is ion-implanted into the mg-doped region 24 in the active region 110 by performing the multiple-step implantation through a mask 80-6 with the accelerating voltage being set to 10, 20, 40, 70, 110 and 150 keV and the dosage being set to $1E+15$ $cm^{-2}$ or higher and $1E+16$ $cm^{-2}$ or lower.

Figure 6G:
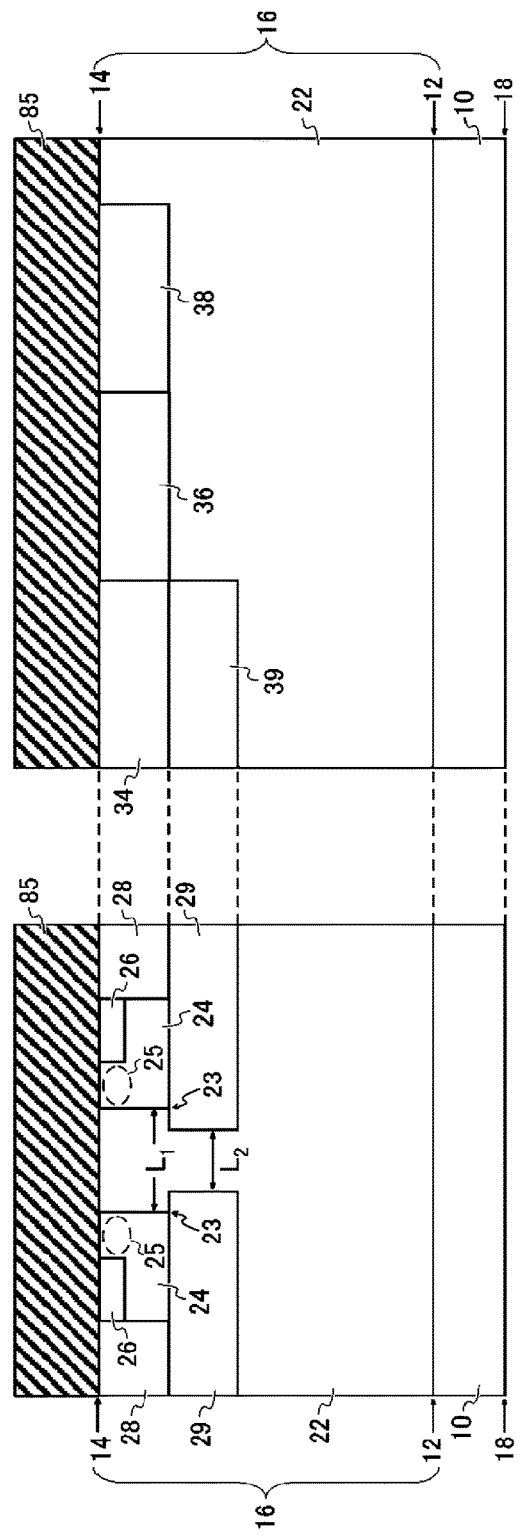
FIG. 6G shows a step S260.

FIG. 6G shows the step S260. In the step S260 of the present example, the cap layer 85 is formed on the active region 110 and the edge termination structure region 130 to cover their entire region. Here, the cap layer 85 may be at least provided on and in direct contact with the Mg-doped region 24. The combination of the GaN substrate 10, the GaN layer 16 and the cap layer 85 layered on each other is referred to as a stack structure 90.

The cap layer 85 is capable of preventing the nitrogen atoms from being released from the GaN layer 16. Nitrogen vacancies are formed at the positions in the GaN layer 16 from which the nitrogen atoms are released. Since the nitrogen vacancies may serve as donor-type defects, this may prevent the onset of the p-type characteristics. In the present example, in order to prevent this problem, the cap layer 85 is provided on and in direct contact with the front surface 14 of the GaN layer 16.

Preferably, the cap layer 85 is highly heat-resistant, has good adhesiveness with the front surface 14, does not allow the impurities to diffuse into the GaN layer 16 therefrom and can be selectively removed with respect to the GaN layer 16. When the cap layer 85 is highly heat-resistant, the cap layer 85 is substantially not decomposed to such a degree that no pits (penetrating openings) are formed in the cap layer 85 even if the cap layer 85 is subjected to annealing at a temperature of 1100° C. or higher and 1400° C. or lower.

In the present example, the cap layer 85 is an AlN layer, but may be a silicon dioxide ($SiO_2$) or silicon nitride (SiN) layer. However, the AlN layer is preferable in order to eliminate the likelihood of the diffusion of Si or O into the GaN layer 16. Here, the cap layer 85 may be a layered structure including one or more of a $SiO_2$ layer, an SiN layer and a GaN layer on the AlN layer. In this case, the AlN layer may also serve as a layer of blocking the n-type impurities from diffusing.

Figure 6H:
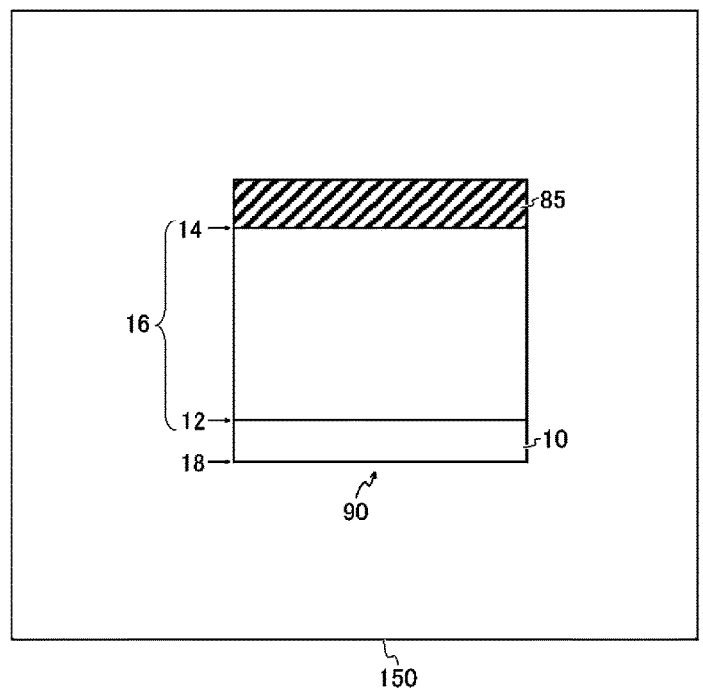
FIG. 6H shows a step S270.

FIG. 6H shows the step S270. In the step S270 of the present example, an annealing apparatus 150 is used to perform annealing on the stack structure 90 at a temperature of 1100° C. or higher and 1400° C. or lower. This can anneal the region into which Mg has been implanted, including the Mg-doped region 24 and the like. The annealing can repair the defects caused by the ion implantation to some extent but does not necessarily achieve the p-type electrical characteristics.

Figure 6I:
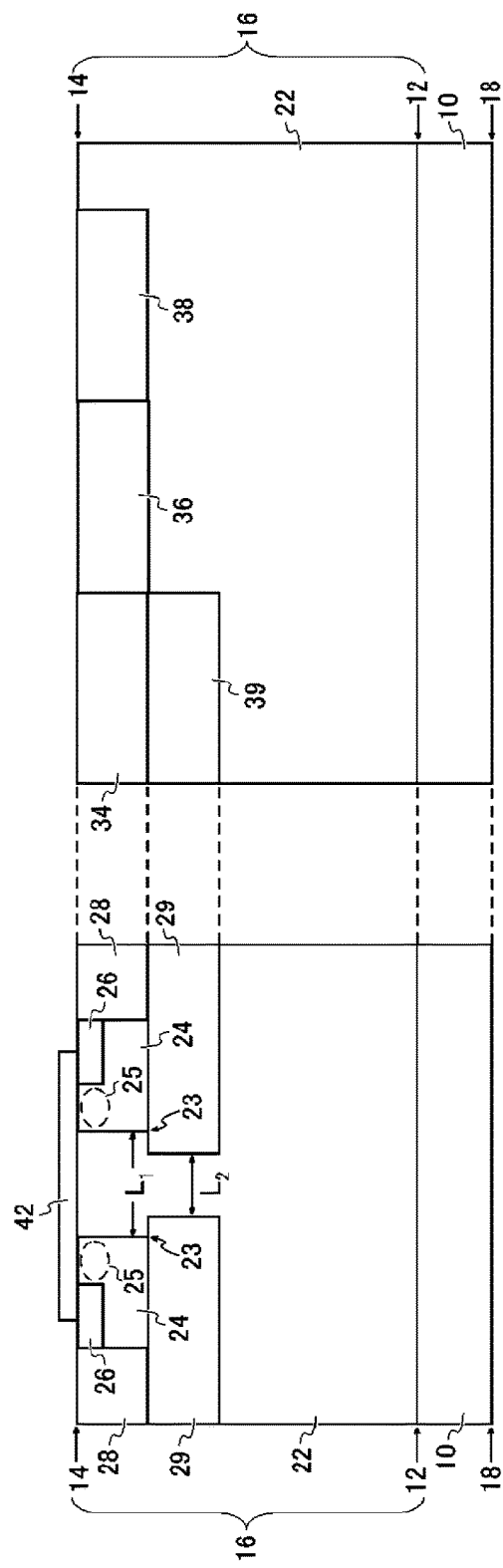
FIG. 6I shows a step S280.

FIG. 6I shows the step S280. In the step S280 of the present example, the gate insulator film 42 is formed to cover at least the Mg-doped region 24 that is exposed at the front surface 14. The gate insulator film 42 may be formed using chemical vapor deposition (CVD) and then shaped into a predetermined shape through photolithography and etching processes. The gate insulator film 42 may have a thickness of 100 nm. The gate insulator film 42 may be a $SiO_2$ film, or an aluminum oxide ($Al_2O_3$) film.

FIG. 6J shows the step S290. In the step S290 of the present example, the gate electrode 44 that is in direct contact with the gate insulator film 42, the source electrode 54 that is in direct contact with the $n^+$-type region 26 and the high-concentration Mg-doped upper region 28, the drain electrode 64 that is in direct contact with the back surface 18, and a protective film 70 are formed. The gate electrode 44 may be made of polysilicon. The source electrode 54 and the electrode 56 may be each a stack structure including a titanium (Ti) layer as the lower layer and an Al layer as the upper layer. The drain electrode 64 may be a stack structure including a Ti layer, which is positioned under the back surface 18, and an Al layer, which is positioned under the Ti layer. The protective film 70 is a passivation film. The protective film 70 may cover the GaN layer 16, which is exposed at the front surface 14.

In the present example, the protective film 70 covers the front surface 14 of the GaN layer 16, which is exposed in the edge termination structure region 130. This can prevent impurities from entering the GaN layer 16 through the front surface 14. In the present example, the protective film 70 is an $SiO_2$ film. Lastly, the gate pad 112 and the source pad 114, and the interlayer insulating film that insulates the gate pad 112 and the source pad 114 from each other are formed. In the above-described manner, the vertical MOSFET 100 is completed.

FIG. 7 is a schematic view showing a cross-section along A-A' and a cross-section along B-B' of a vertical MOSFET 300 relating to a second embodiment. The second embodiment is different from the first embodiment in which Mg is ion-implanted into the n-type layer 22. In the present example, a high-concentration Mg-doped layer 310 that is epitaxially formed on the n-type layer 22 is partially removed using etching, after which an n-type layer 320 is further epitaxially formed. The high-concentration Mg-doped layer 310 and the n-type layer 320 will be described later. After this, Mg is ion-implanted into the n-type layer 322. In this manner, the Mg-doped region 24 is formed. Here, the n-type layer 322 may have the same capability as the n-type layer 22. In the present example, the top surface of the n-type layer 322 is referred to as the front surface 14. The above is the main difference between the first embodiment and the second embodiment. Note that, in the present example, the first and second directions are defined in the same manner as in the first embodiment. The present example can also produce all of the same advantageous effects as the first embodiment.

Figure 8:
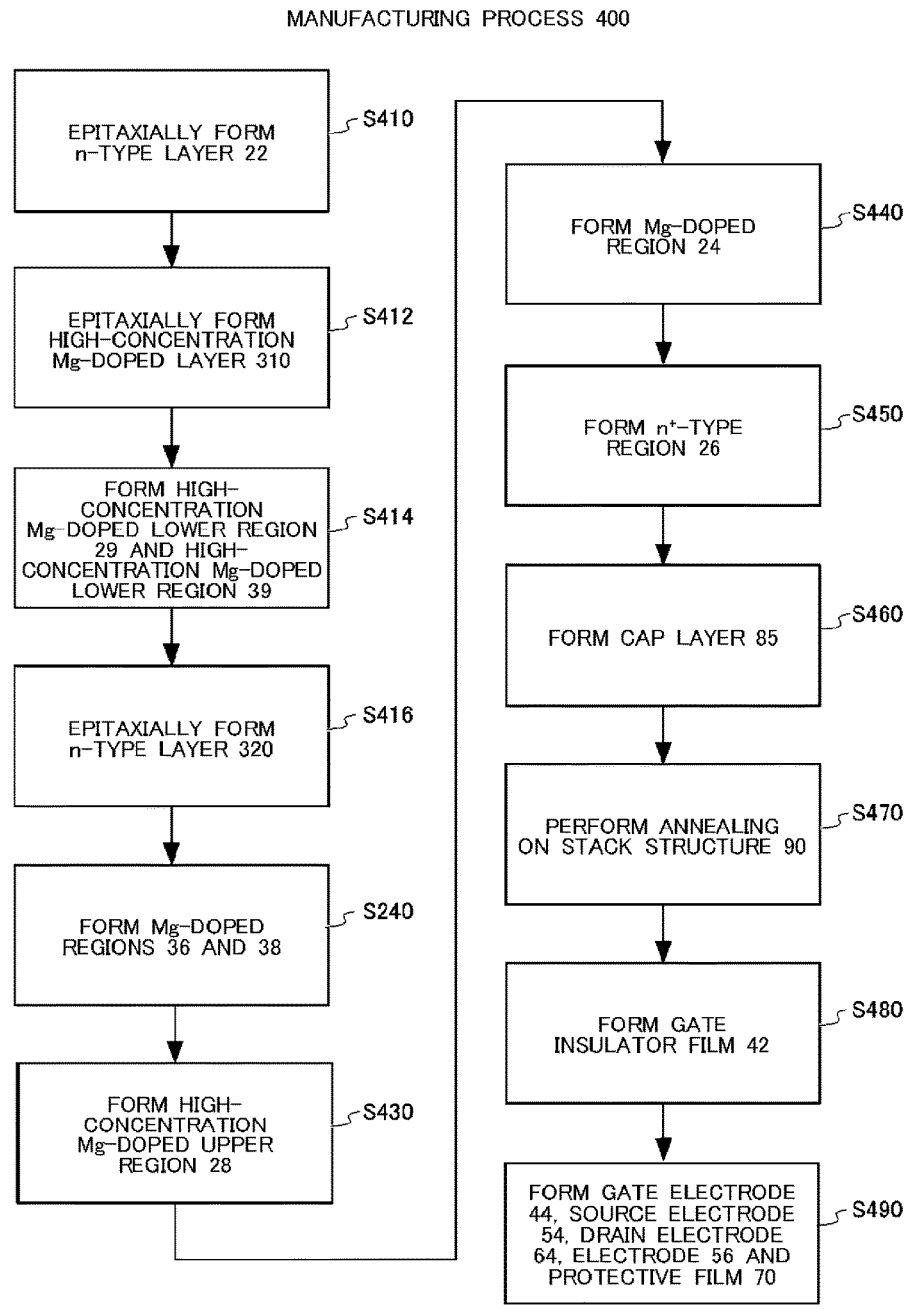
FIG. 8 is a flow chart showing a manufacturing process 400 for a vertical MOSFET 300.

FIG. 8 is a flow chart showing a manufacturing process 400 for a vertical MOSFET 300. The manufacturing process 400 of the present example includes a step of forming the high-concentration Mg-doped layer 310 (step S412), a step of forming the high-concentration Mg-doped lower regions 29 and 39 by partially etching the high-concentration Mg-doped layer 310 (step S414), and a step of forming the n-type layer 320 (step S416). In addition, the manufacturing process 400 of the present example includes a step of forming the high-concentration Mg-doped upper region 28 (step S430), which corresponds to the step S230-2 of the first embodiment. In this regard, the second embodiment is different from the first embodiment.

Note that the n-type layer 322 of the present example has a depression since it is provided on a pair of high-concentration Mg-doped lower regions 29. The depression, however, does not result from the etching of GaN. Therefore, the channel forming region 25 is not damaged. Note that, in the present example, the gate electrode 44 is not a trench gate but a planar gate.

Figure 9A:
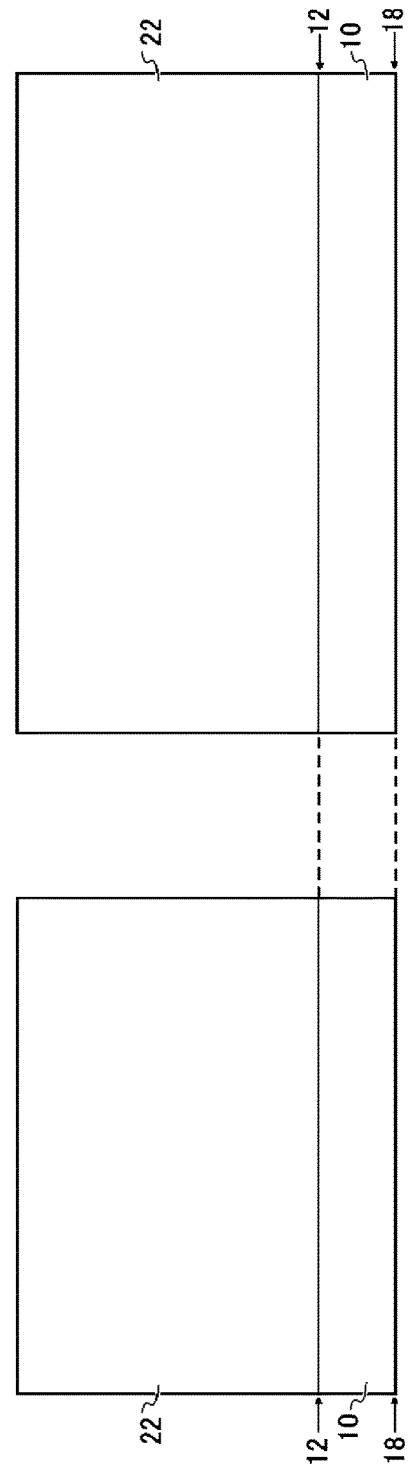
FIG. 9A shows a step S410.

FIG. 9A shows the step S410. The step S410 of the present example is the same as the step S210 of the first embodiment and thus not described here.

Figure 9B:
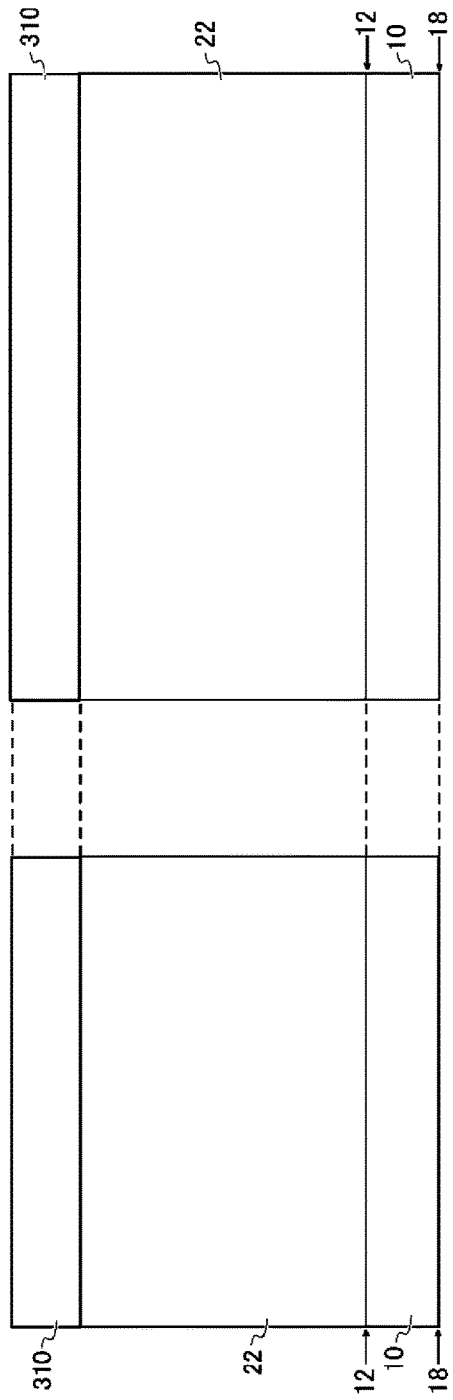
FIG. 9B shows a step S412.

FIG. 9B shows the step S412. In the step S412 of the present example, the high-concentration Mg-doped layer 310 that is in direct contact with the n-type layer 22 is epitaxially formed on the n-type layer 22. The high-concentration Mg-doped layer 310 may have an impurity concentration of $1E+18$ $cm^{-3}$ or higher and $1E+20$ $cm^{-3}$ or lower.

FIG. 9C shows the step S414. In the step S414 of the present example, photolithography and etching processes are performed to shape the high-concentration Mg-doped layer 310 into a predetermined shape. As a result, the high-concentration Mg-doped lower regions 29 and 39 are formed.

Figure 9D:
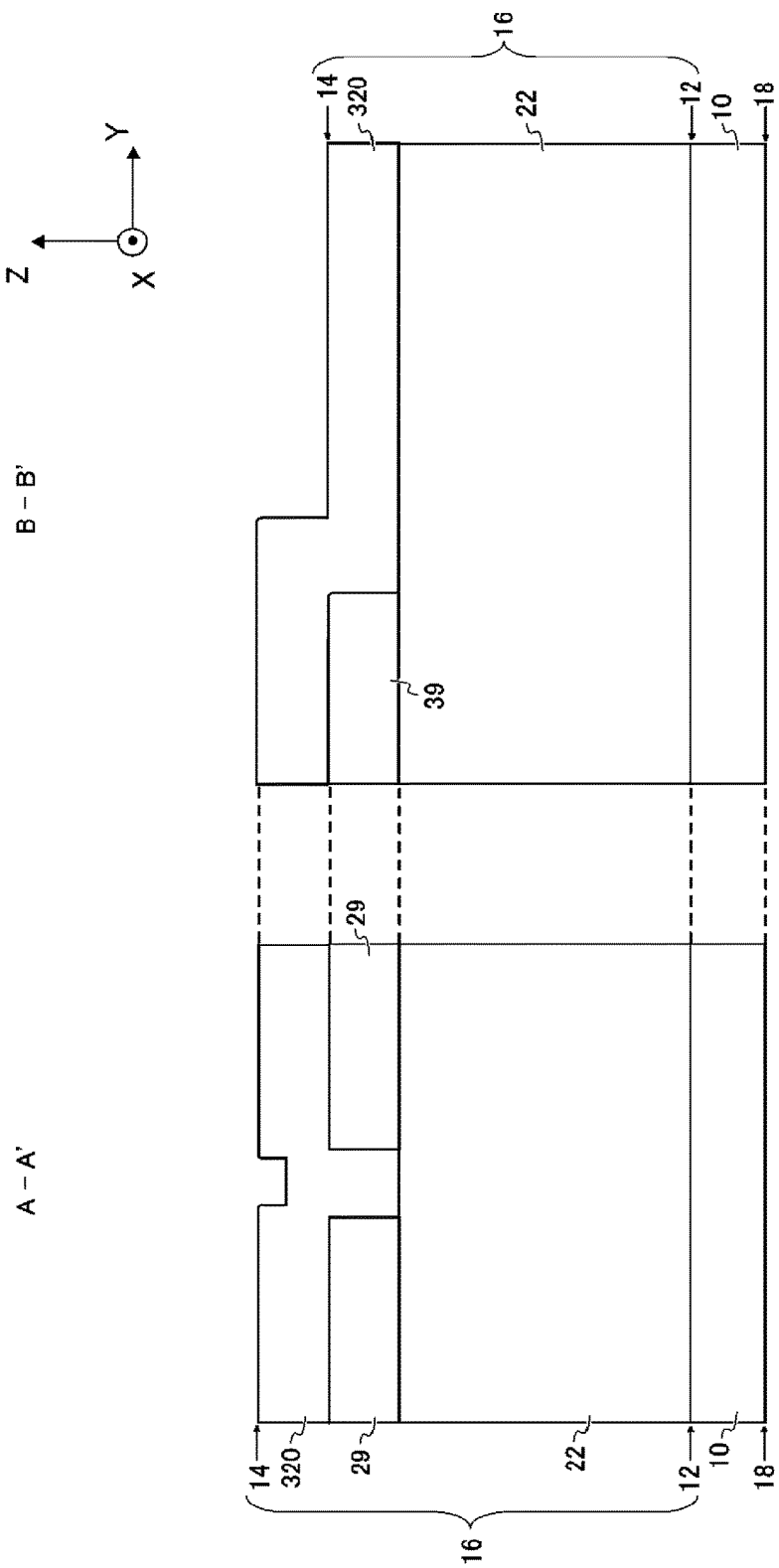
FIG. 9D shows a step S416.

FIG. 9D shows the step S416. In the step S416 of the present example, the n-type layer 320 is epitaxially formed on the exposed front surface 14 and on the high-concentration Mg-doped lower regions 29 and 39. The n-type layer 320 may have a thickness of 0.1 μm or more and 1 μm or less. The n-type layer 320 may contain Si at a concentration of $1E+15$ $cm^{-3}$ or higher and $5E+15$ $cm^{-3}$ or lower.

Figure 9E:
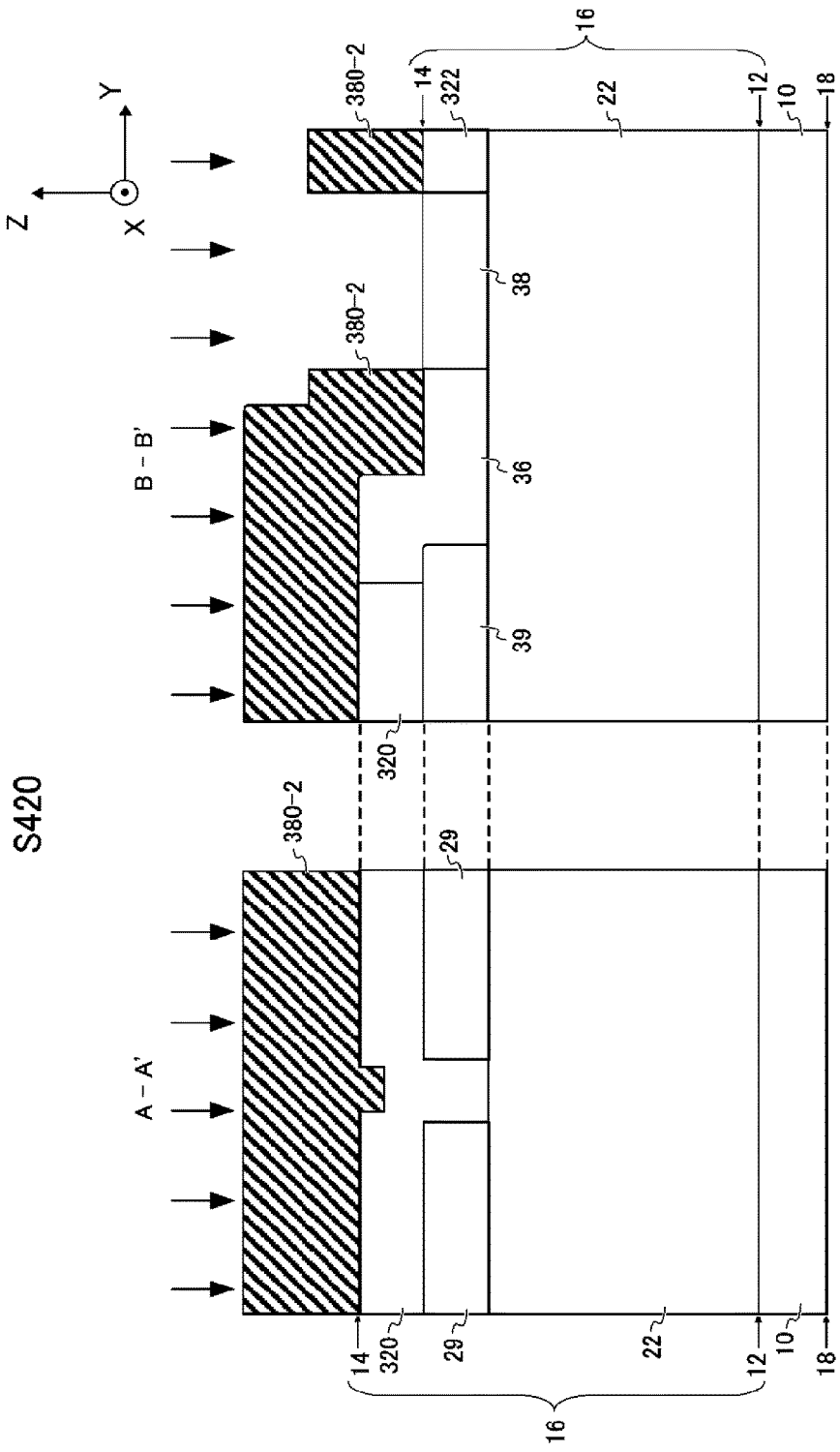
FIG. 9E shows a step S420.

FIG. 9E shows the step S420. In the step S420 of the present example, the Mg-doped regions 36 and 38 are sequentially formed by performing ion implantation through a mask 380-2, as in the step S220 of the first embodiment. The accelerating voltage and dosage may be set in the same manner as in the first embodiment. When the step S420 and subsequent steps are described, the outmost n-type layer 320 is referred to as the n-type layer 322.

Figure 9F:
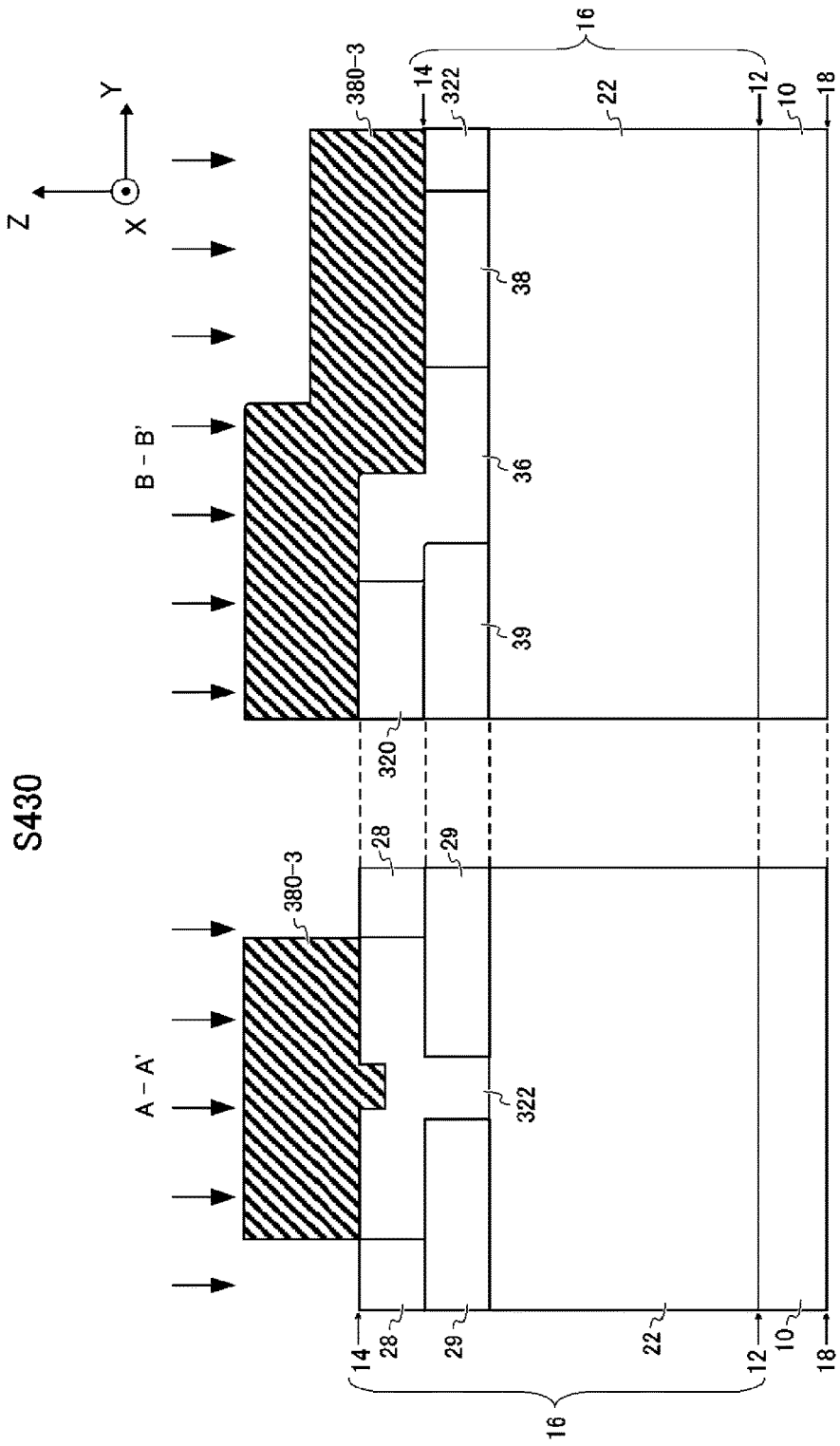
FIG. 9F shows a step S430.
Figure 9G:
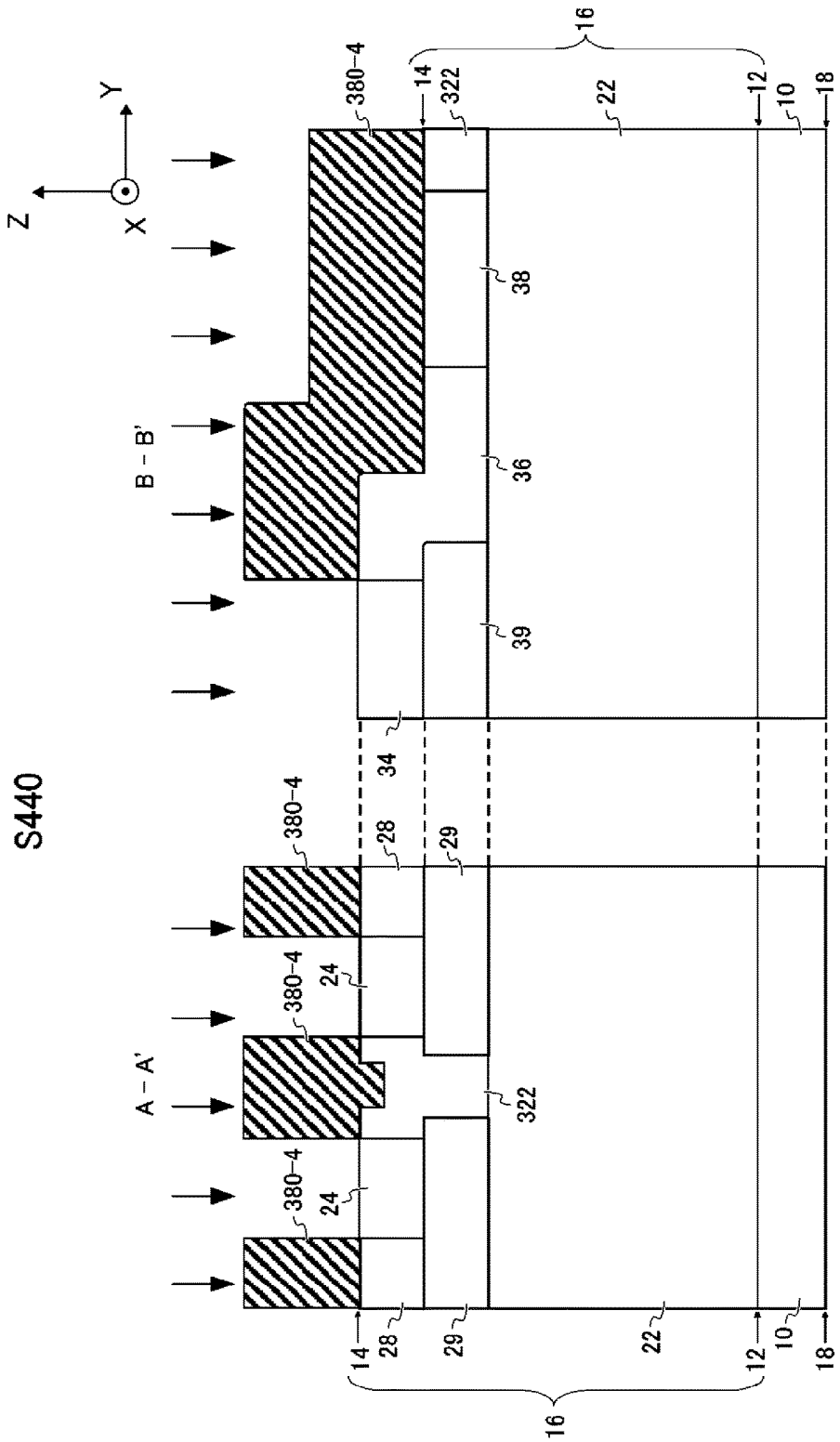
FIG. 9G shows a step S440.
Figure 9H:
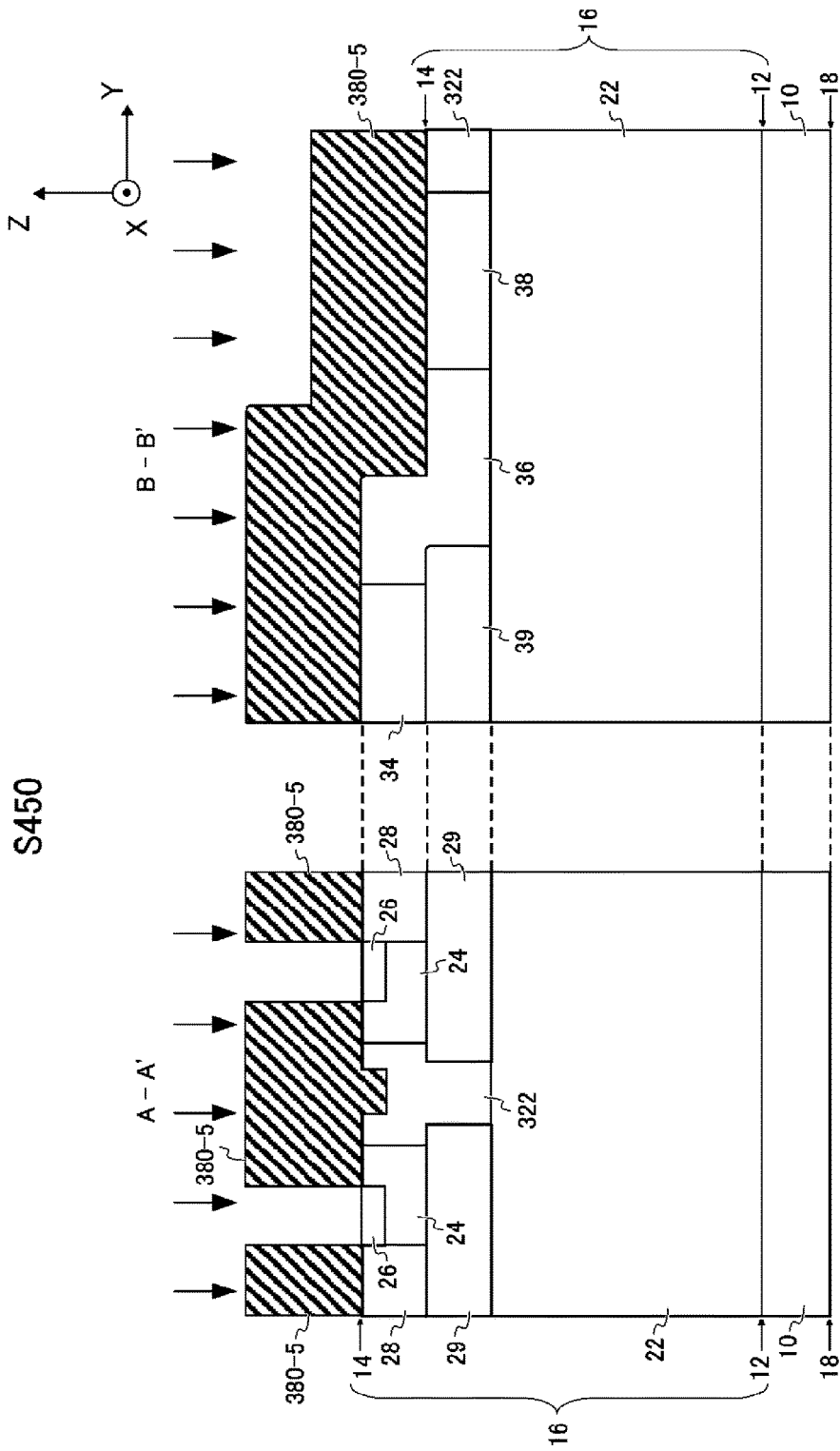
FIG. 9H shows a step S450.
Figure 9K:
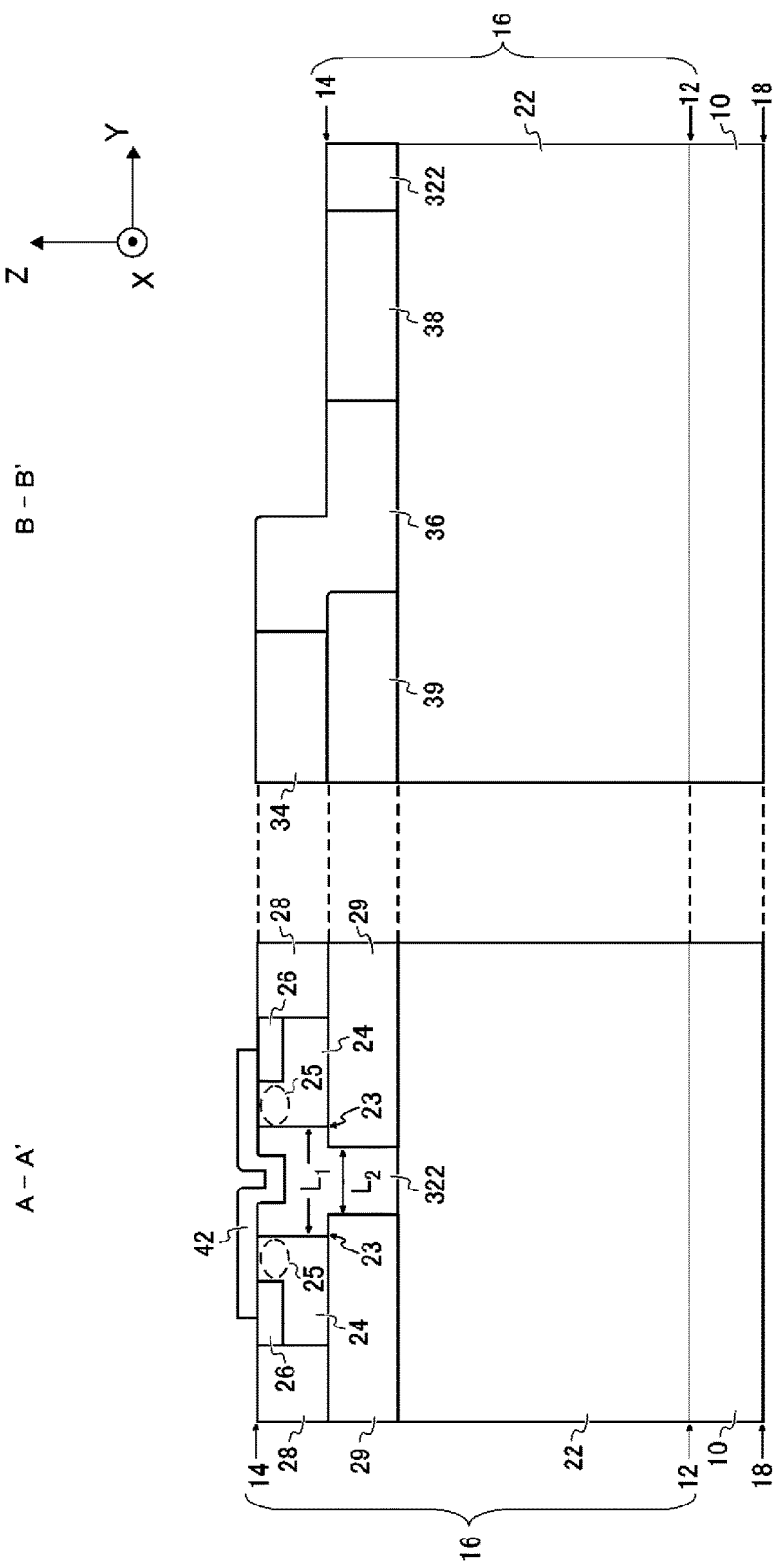
FIG. 9K shows a step S480.

FIG. 9F shows the step S430. The step S430 of the present example is the same as the step S230-2 of the first embodiment and thus not described here. In the step S430 and subsequent steps, the n-type layer 320 in the active region 110 (the A-A' cross-section) is referred to as the n-type layer 322.

FIGS. 9G, 9H, 9I, 9J, 9K and 9L respectively show the steps S440, S450, S460, S470, S480 and S490. The steps S440 to S490 of the present example are substantially the same as the steps S240 to S290 of the first embodiment respectively and thus not described here. Lastly, the gate pad 112 and the source pad 114, and the interlayer insulating film that insulates the gate pad 112 and the source pad 114 from each other are formed. In the above-described manner, the vertical MOSFET 300 is completed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTION OF REFERENCE NUMERALS

10: GaN substrate, 12: boundary, 14: front surface, 16: GaN layer, 18: back surface, 22: n-type layer, 23: corner, 24: Mg-doped region, 25: channel forming region, 26: $n^+$-type region, 28: high-concentration Mg-doped upper region, 29: high-concentration Mg-doped lower region, 34: Mg-doped region, 36: Mg-doped region, 38: Mg-doped region, 39: high-concentration Mg-doped lower region, 40: gate terminal, 42: gate insulator film, 44: gate electrode, 50: source terminal, 54: source electrode, 56: electrode, 60: drain terminal, 64: drain electrode, 70: protective film, 74: guard ring structure, 78: JTE structure, 80: mask, 85: cap layer, 90: stack structure, 100: vertical MOSFET, 110: active region, 112: gate pad, 114: source pad, 130: edge termination structure region, 150: annealing apparatus, 200: manufacturing process, 300: MOSFET, 310: high-concentration Mg-doped layer, 320: n-type layer, 322: n-type layer, 380: mask, 400: manufacturing process

What is claimed is:

1. A manufacturing method of a semiconductor device including a vertical MOSFET having a planar gate, the manufacturing method of a semiconductor device comprising:

forming an n-type gallium nitride layer on a gallium nitride monocrystalline substrate having a threading dislocation density of less than $1E+7$ $cm^{-2}$; and forming an impurity-implanted region that contains impurities at a uniform concentration in a direction parallel to a main surface of the gallium nitride monocrystalline substrate, by ion-implanting the impurities into the n-type gallium nitride layer, the impurities including at least one element selected from among magnesium, beryllium, calcium and zinc, wherein at least part of the impurity-implanted region serves as a channel forming region of the vertical MOSFET.

2. The manufacturing method of a semiconductor device as set forth in claim 1, wherein during the formation of the impurity-implanted region, the impurities are ion-implanted into the n-type gallium nitride layer by accelerating the impurities with an energy of 10 keV or higher and 200 keV or lower depending on a depth of the impurity-implanted region and with a dosage being set to $1E+12$ $cm^{-2}$ or higher and $1E+14$ $cm^{-2}$ or lower.

3. The manufacturing method of a semiconductor device as set forth in claim 2, wherein the impurity-implanted region contains the impurities at a concentration of $1E+16$ $cm^{-3}$ or higher and $1E+18$ $cm^{-3}$ or lower.

4. The manufacturing method of a semiconductor device as set forth in claim 1, further comprising
subsequent to the formation of the n-type gallium nitride layer and prior to the formation of the impurity-implanted region, forming a high-concentration impurity region containing the impurities at a high concentration at a position deeper than the impurity-implanted region.

5. The manufacturing method of a semiconductor device as set forth in claim 4, wherein
during the formation of the high-concentration impurity region,
the impurities are ion-implanted into the n-type gallium nitride layer by accelerating the impurities with an energy of 300 keV or higher and 800 keV or lower depending on a depth of the high-concentration impurity region and with a dosage being set to $1E+14$ cm$^{-2}$ or higher and $1E+15$ cm$^{-2}$ or lower.

6. The manufacturing method of a semiconductor device as set forth in claim 5, wherein
the high-concentration impurity region contains the impurities at a concentration of $1E+19$ cm-3 or higher and $1E+20$ cm-3 or lower.

7. The manufacturing method of a semiconductor device as set forth in claim 4, wherein
during the formation of the high-concentration impurity region,
the high-concentration impurity region containing the impurities at a concentration of $1E+18$ cm-3 or higher and $1E+20$ cm-3 or lower is epitaxially formed on the n-type gallium nitride layer.

8. The manufacturing method of a semiconductor device as set forth in claim 1, wherein
the impurities are magnesium.

9. The manufacturing method of a semiconductor device as set forth in claim 1, further comprising:
subsequent to the formation of the impurity-implanted region, forming a cap layer on the impurity-implanted region, the cap layer being in direct contact with the impurity-implanted region; and
subsequent to the formation of the cap layer, performing annealing on the impurity-implanted region at a temperature of 1100° C. or higher and 1400° C. or lower.

10. The manufacturing method of a semiconductor device as set forth in claim 1, wherein:
the n-type gallium nitride layer is not subjected to etching, and
concentration distribution of the impurities in the impurity-implanted region in the n-type gallium nitride layer is regulated by the ion-implantation in place of thermal diffusion.

* * * * *